United States Patent
Kosugi et al.

(10) Patent No.: US 10,741,648 B2
(45) Date of Patent: Aug. 11, 2020

(54) SEMICONDUCTOR DEVICE AND MANUFACTURING METHOD THEREOF

(71) Applicants: National Institute of Advanced Industrial Science and Technology, Chiyoda-ku, Tokyo (JP); Hitachi, LTD., Chiyoda-ku, Tokyo (JP); Fuji Electric Co., Ltd, Kawasaki-shi, Kanagawa (JP); Mitsubishi Electric Corporation, Chiyoda-ku, Tokyo (JP)

(72) Inventors: Ryoji Kosugi, Ibaraki (JP); Shiyang Ji, Ibaraki (JP); Kazuhiro Mochizuki, Ibaraki (JP); Yasuyuki Kawada, Ibaraki (JP); Hidenori Kouketsu, Ibaraki (JP)

(73) Assignees: National Institute of Advanced Industrial Science and Technology, Tokyo (JP); Hitachi, Ltd, Tokyo (JP); Fuji Electric Co., Ltd, Kawasaki-shi, Kanagawa (JP); Mitsubishi Electric Corporation, Tokyo (JP)

( * ) Notice: Subject to any disclaimer, the term of this patent is extended or adjusted under 35 U.S.C. 154(b) by 4 days.

(21) Appl. No.: 16/308,913

(22) PCT Filed: Jun. 2, 2017

(86) PCT No.: PCT/JP2017/020610
§ 371 (c)(1),
(2) Date: Dec. 11, 2018

(87) PCT Pub. No.: WO2018/016201
PCT Pub. Date: Jan. 25, 2018

(65) Prior Publication Data
US 2019/0157399 A1 May 23, 2019

(30) Foreign Application Priority Data

Jul. 19, 2016 (JP) ................. 2016-141048
Sep. 21, 2016 (JP) ................. 2016-184043

(51) Int. Cl.
*H01L 29/06* (2006.01)
*H01L 29/16* (2006.01)
(Continued)

(52) U.S. Cl.
CPC .... *H01L 29/1608* (2013.01); *H01L 21/02378* (2013.01); *H01L 21/02433* (2013.01);
(Continued)

(58) Field of Classification Search
CPC ............... H01L 29/0634; H01L 29/045; H01L 29/1608
See application file for complete search history.

(56) References Cited

U.S. PATENT DOCUMENTS

2015/0137221 A1* 5/2015 Kiyosawa ........... H01L 21/3247 257/330
2016/0087032 A1 3/2016 Hiyoshi
(Continued)

FOREIGN PATENT DOCUMENTS

JP 2000001389 A 1/2000
JP 2000001398 A 1/2000
(Continued)

OTHER PUBLICATIONS

International Search Report for Serial No. PCT/JP2017/020610 dated Aug. 1, 2017.
(Continued)

*Primary Examiner* — Errol V Fernandes
(74) *Attorney, Agent, or Firm* — McCormick, Paulding & Huber PLLC

(57) ABSTRACT

A manufacturing yield and reliability of a semiconductor device including a power semiconductor element is improved. A plurality of trenches DT extending in an x direction and spaced apart from each other in a y direction orthogonal to the x direction are formed in a substrate having a main crystal surface tilted with respect to a <11-20>
(Continued)

direction. Also, a super-junction structure is constituted of a p-type column region PC made of a semiconductor layer embedded in the trench DT and an n-type column region NC made of a part of the substrate between the trenches DT adjacent in the y direction, and an angle error between the extending direction of the trench DT (x direction) and the <11-20> direction is within ±θ. The θ is determined by {arctan {k× (w/h)}}/13 for the trench having a height of h and a width of w. Herein, the k is at least smaller than 2, preferably 0.9 or less, more preferably 0.5 or less, and still more preferably 0.3 or less.

19 Claims, 26 Drawing Sheets

(51) Int. Cl.
  *H01L 29/78* (2006.01)
  *H01L 29/12* (2006.01)
  *H01L 21/02* (2006.01)
  *H01L 21/308* (2006.01)
  *H01L 29/04* (2006.01)

(52) U.S. Cl.
  CPC .. *H01L 21/02529* (2013.01); *H01L 21/02636* (2013.01); *H01L 21/3083* (2013.01); *H01L 29/045* (2013.01); *H01L 29/0634* (2013.01); *H01L 29/12* (2013.01); *H01L 29/78* (2013.01)

(56) References Cited

U.S. PATENT DOCUMENTS

2016/0190301 A1* 6/2016 Aichinger ........... H01L 29/0696
  257/77
2016/0260798 A1* 9/2016 Rupp ................. H01L 29/4238

FOREIGN PATENT DOCUMENTS

| | | |
|---|---|---|
| JP | 2008311621 A | 12/2008 |
| JP | 2013089723 A | 5/2013 |
| JP | 2013138171 A | 7/2013 |
| JP | 2015032611 A | 2/2015 |
| JP | 2016066669 A | 4/2016 |

OTHER PUBLICATIONS

Ryoji Kosugi et al., "Development of SiC super-junction (SJ) device by deep trench-filling epitaxial growth," Materials Science Forum, vols. 740-742, p. 785-788, (2013).

Japanese Office Action and English Translation for Serial No. 2017114848 dated Mar. 31, 2020.

* cited by examiner

DT : TRENCH
NC : n-TYPE COLUMN REGION
OF : ORIENTATION FLAT
PC : p-TYPE COLUMN REGION
SC : SEMICONDUCTOR CHIP
SW : SiC SINGLE CRYSTAL SUBSTRATE

FIG. 21
(a)
HCl/SiH4=33.3
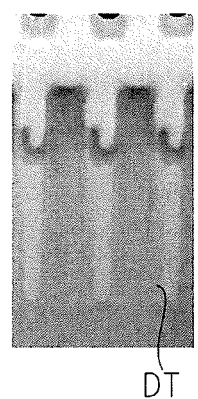
DT
(b)
HCl/SiH4=50
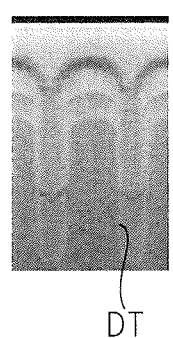
DT
(c)
HCl/SiH4=66.7
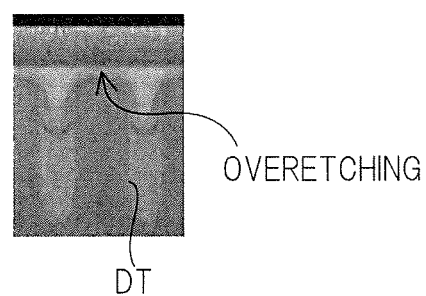
OVERETCHING
DT

| Level | GR (μm/h) | L-width | θ | k |
|---|---|---|---|---|
| 50% | 3.36 | 0.77 deg. | 0.38 deg. | 0.9 |
| 80% | 3.94 | 0.44 deg. | 0.22 deg. | 0.5 |
| 90% | 4.14 | 0.30 deg. | 0.15 deg. | 0.3 |

$k=(h/w)\tan(13\theta)$
$h=23.5\mu m$
$w=2.385\mu m$

SEMICONDUCTOR DEVICE AND MANUFACTURING METHOD THEREOF

CROSS-REFERENCE TO RELATED APPLICATIONS

This application is a National Stage application of International Patent Application No. PCT/JP2017/020610, filed on Jun. 2, 2017, which claims priority to Japanese Patent Application No. 2016-141048, filed on Jul. 19, 2016, and Japanese Patent Application No. 2016-184043, filed on Sep. 21, 2016, each of which is hereby incorporated by reference in its entirety.

TECHNICAL FIELD

The present invention relates to a semiconductor device and a manufacturing method thereof, and is suitably applicable to a semiconductor device including a power semiconductor element typified by, for example, a power MOSFET (Metal Oxide Semiconductor Field Effect Transistor) and a manufacturing method thereof.

BACKGROUND

As a background art in this technical field, for example, there are Japanese Patent Application Laid-Open Publication No. 2013-138171 and Ryoji Kosugi et. al., Development of SiC super-junction (SJ) device by deep trench-filling epitaxial growth, Materials Science Forum Vols. 740-742 (2013) pp 785-788.

Japanese Patent Application Laid-Open Publication No. 2013-138171 describes a semiconductor device in which an n-type charge amount and a p-type charge amount in an n-type column region and a p-type column region constituting a super-junction structure are equalized in a cell region, and a charge balance change region in which the n-type charge amount in the super-junction structure is gradually made larger than the p-type charge amount as going toward an outer circumferential direction of the cell region is provided in a peripheral region.

In addition, Ryoji Kosugi et. al., Development of SiC super-junction (SJ) device by deep trench-filling epitaxial growth, Materials Science Forum Vols. 740-742 (2013) pp 785-788 reports an example in which a trench having a width of 2.7 μm and a depth of 7 μm formed in a 4H—SiC substrate is backfilled with an SiC layer without generating a void on the premise of the manufacture of the super-junction structure.

SUMMARY

The power semiconductor element having the super-junction structure has an advantage of being able to reduce the on-resistance while securing the high withstand voltage.

The trench backfill method (referred to also as trench fill method) is known as one of the forming methods of the super-junction structure. The trench backfill method is considered as being effective for the reduction of the on-resistance in a wide range of withstand voltage because it is possible to manufacture the super-junction structure having a deep trench. However, although a trench having a high aspect ratio is required in order to realize a power semiconductor element with high withstand voltage, it is not easy in the trench backfill method to backfill the trench having the high aspect ratio with satisfactory yield by the filling epitaxial growth method, and there is an issue of the low manufacturing yield of the semiconductor device including the power semiconductor element.

Note that, in Ryoji Kosugi et. al., Development of SiC super-junction (SJ) device by deep trench-filling epitaxial growth, Materials Science Forum Vols. 740-742 (2013) pp 785-788 as well, the reproducibility of the successful backfilling is low, and the cause thereof is unknown.

One example of a semiconductor device as typical means for solving the issue described above is as follows. That is, a semiconductor device is configured to comprise: a single crystal substrate having a main crystal surface tilted with respect to a reference crystal direction which is a predetermined crystal direction; a plurality of trenches provided in the substrate so as to extend in a first direction along the main crystal surface of the substrate and to be spaced apart from each other in a second direction orthogonal to the first direction along the main crystal surface of the substrate; a first column region provided inside the trench and made of a crystal layer having the same crystal structure as that of the substrate; and a second column region made of a part of the substrate between the trenches adjacent to each other in the second direction, an angle error between the reference crystal direction and the first direction is within ±θ, and the θ is defined by θ={arctan {k×(w/h)}}/13 when a depth of the trench is h, a width of the trench is w, and k is a coefficient smaller than 2.

One example of a manufacturing method of a semiconductor device as another typical means is as follows. That is, a manufacturing method of a semiconductor device comprises the steps of: preparing a single crystal substrate having a main crystal surface tilted with respect to a reference crystal direction which is a predetermined crystal direction and a reference mark provided with a first angle error with respect to the reference crystal direction; preparing a photomask for forming a mask pattern for etching on the substrate in order to form a plurality trenches extending in a first direction along the main crystal surface of the substrate and spaced apart from each other in a second direction orthogonal to the first direction along the main crystal surface of the substrate; forming the etching pattern on the substrate by using the photomask; forming the plurality of trenches in the substrate by using the etching pattern; and filling insides of the plurality of trenches with a crystal layer having the same crystal structure as the substrate by a crystal growth method, an angle error between the reference crystal direction and the first direction is within ±θ, and the θ is defined by θ={arctan {k×(w/h)}}/13 when a depth of the trench is h, a width of the trench is w, and k is a coefficient smaller than 2.

According to the present invention, it is possible to improve the manufacturing yield and the reliability of the semiconductor device including the power semiconductor element.

The issues, configurations and effects other than those described above will be clarified by the following descriptions of the embodiments.

BRIEF DESCRIPTIONS OF THE DRAWINGS

FIG. 21 is a diagram showing an example of backfilling in the cases where an HCl/SiH$_4$ flow ratio is 33.3, 50, and 66.7 in the filling epitaxial growth method;

Figure 23:
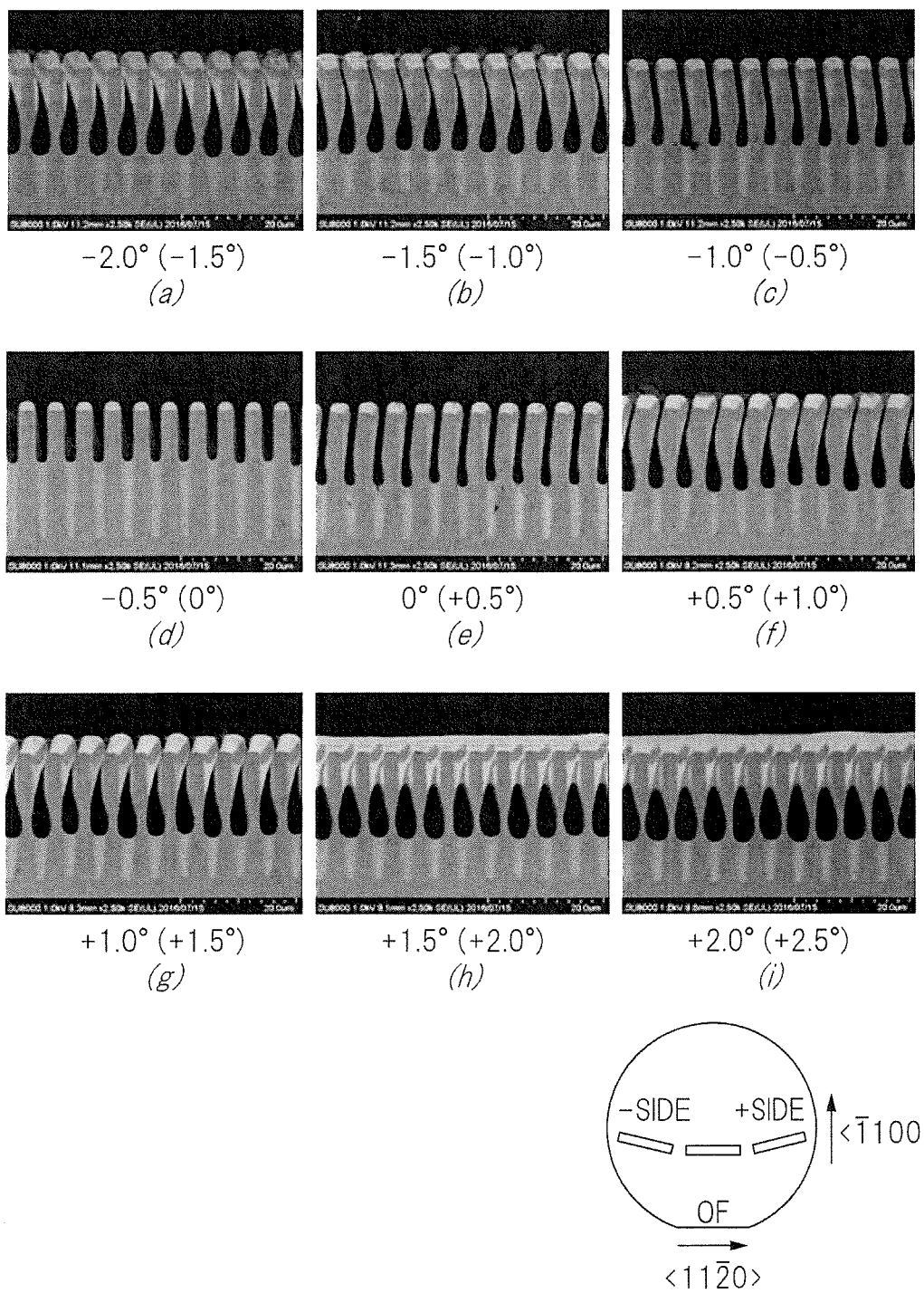
Figure 24:
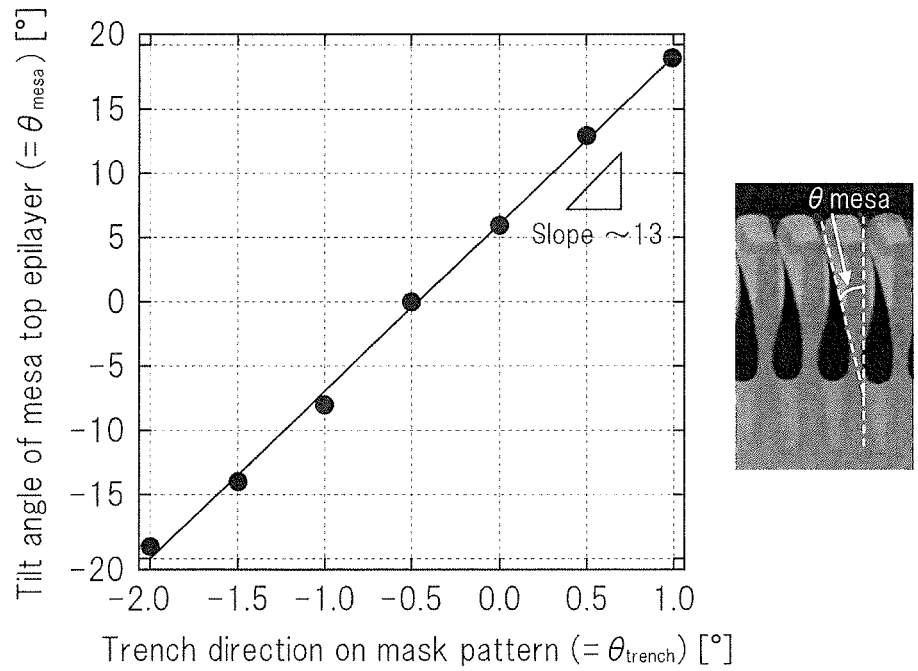
Figure 25:
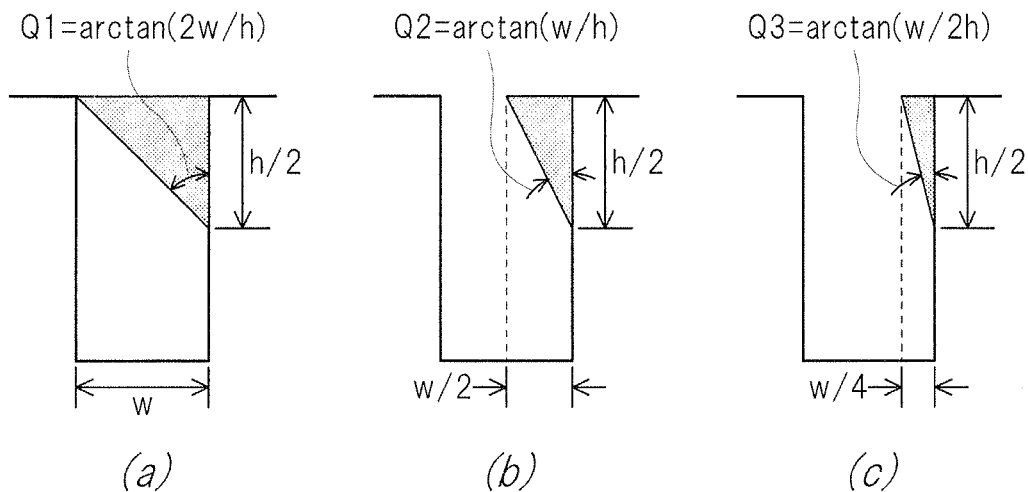
Figure 26:
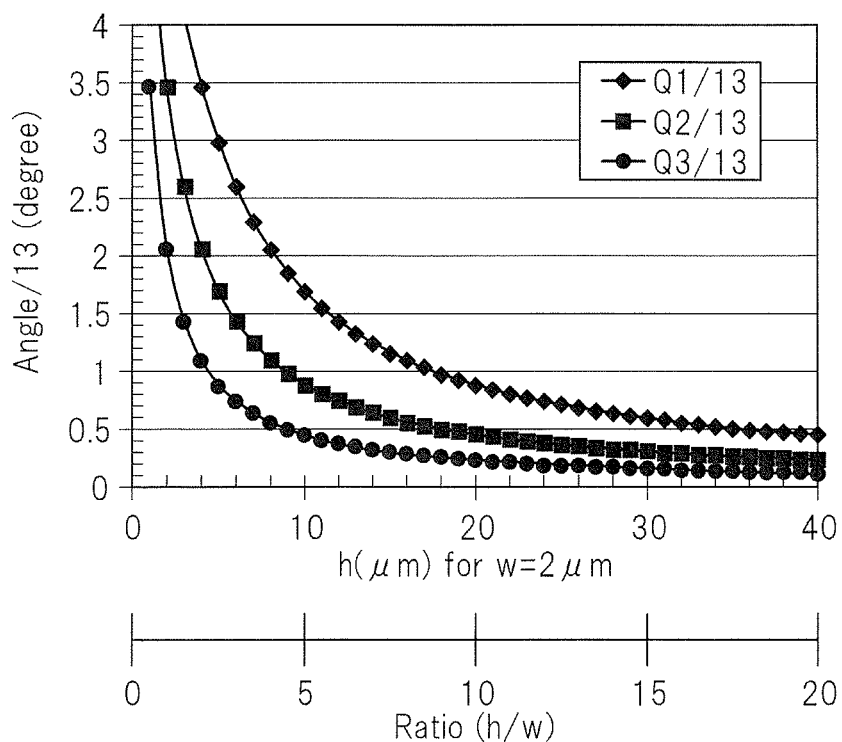
Figures 27, 28:
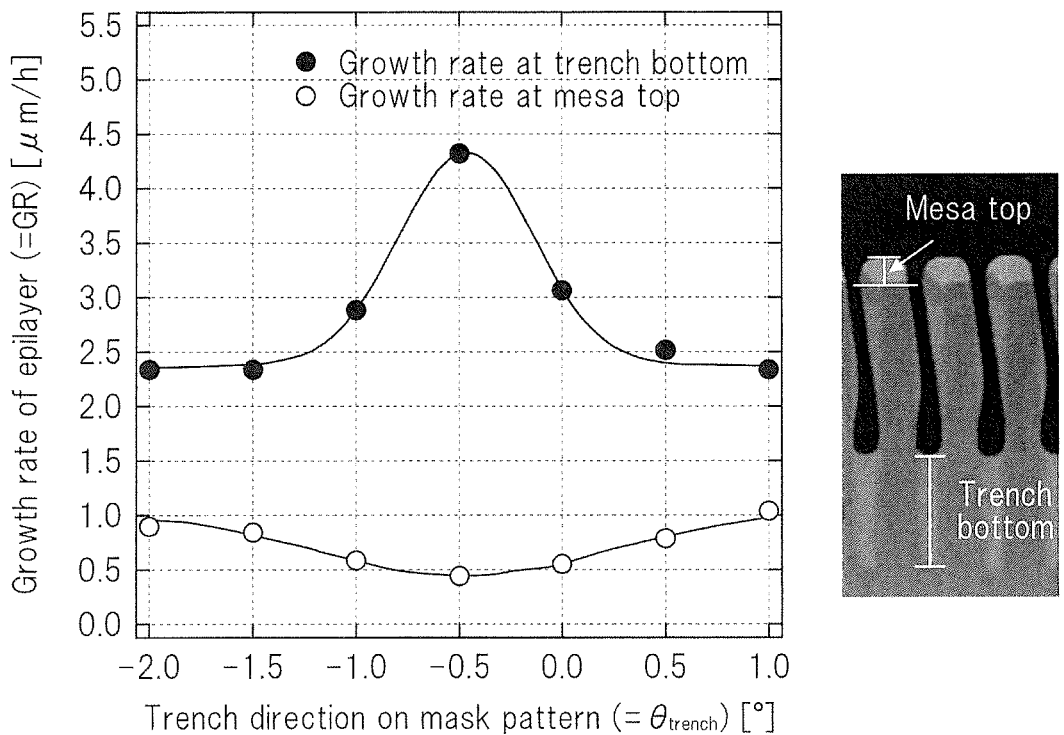
Figure 29:
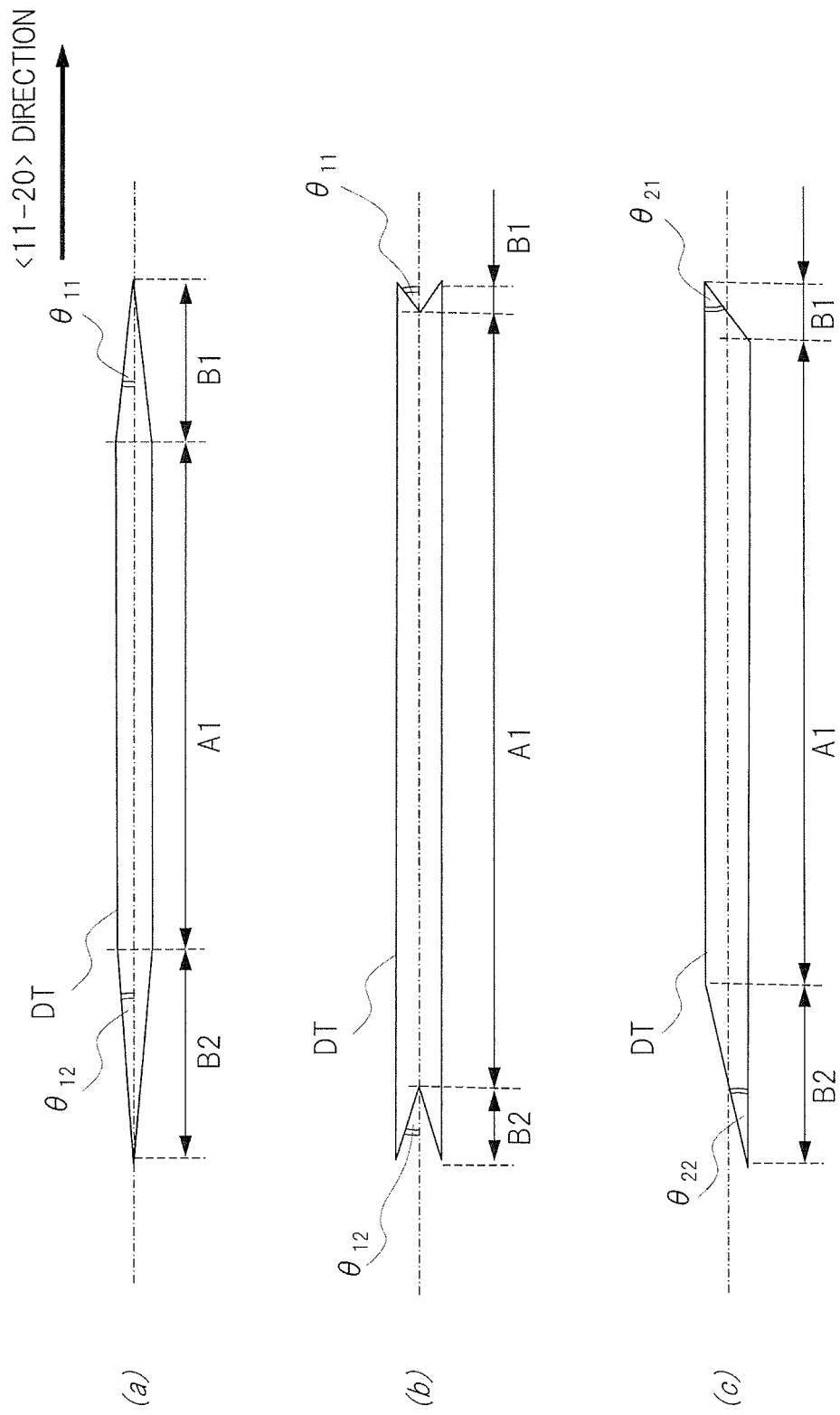

FIGS. 23(a) to 23(i) are cross-sectional SEM images of a plurality of trenches that are formed in a substrate with various tilt angles of an extending direction with respect to <11-20> direction and then are backfilled with a crystal layer;

FIG. 24 is a graph chart showing a relationship between a tilt angle θtrench of a pattern on a photomask with respect to the <11-20> direction and a tilt angle θmesa of the SiC layer formed by crystal growth on a side surface of an upper portion of the trench obtained from FIG. 23;

FIGS. 25(a), 25(b), and 25(c) are schematic diagrams each showing a model for considering a relationship between trench dimensions and a state where the crystal layer closes the trench, in the case where the crystal layer grows in an obliquely tilted manner from the side surface of the upper portion of the trench;

FIG. 26 is a graph chart showing an allowable angle error between the extending direction of the trench and the <11-20> direction calculated from the models shown in FIG. 25 and knowledge C;

FIG. 27 is a graph chart showing a relationship between a tilt angle θtrench of a pattern on a photomask with respect to the <11-20> direction and each of a crystal growth rate at a trench bottom (upper plots in the graph) and a crystal growth rate at a mesa top (lower plots in the graph);

FIG. 28 is a table in which an angle error θ between the extending direction of the trench and the <11-20> direction obtained from a fitting curve of the crystal growth rate at the trench bottom shown in FIG. 27 and an alignment margin coefficient k calculated form the angle error θ are summarized; and FIGS. 29(a), 29(b), and 29(c) are plan views showing modifications of the tip shape of the trench in the second embodiment and the modification of the second embodiment.

DETAILED DESCRIPTION

In the embodiments described below, the invention will be described in a plurality of sections or embodiments when required as a matter of convenience. However, these sections or embodiments are not irrelevant to each other unless otherwise stated, and the one relates to the entire or a part of the other as a modification, details, or a supplementary explanation thereof.

Also, in the embodiments described below, when mentioning the number of elements (including number of pieces, values, amount, range, and the like), the number of the elements is not limited to a specific number unless otherwise stated or except the case where the number is apparently limited to a specific number in principle, and the number larger or smaller than the specified number is also applicable.

Further, in the embodiments described below, it goes without saying that the components (including element steps) are not always indispensable unless otherwise stated or except the case where the components are apparently indispensable in principle.

Also, even when mentioning "made of A", "made up of A", "having A" and "including A", elements other than A are of course not excluded except the case where it is particularly specified that A is the only element thereof. Similarly, in the embodiments described below, when the shape of the components, positional relation thereof, and the like are mentioned, the substantially approximate and similar shapes and the like are included therein unless otherwise stated or except the case where it is conceivable that they are apparently excluded in principle. The same goes for the numerical value and the range described above.

Also, components having the same function are denoted by the same reference characters in principle throughout the drawings for describing the embodiments, and the repetitive description thereof is omitted. Further, the size of respective portions does not correspond to that of an actual device in sectional views and plan views, and a specific portion is shown in a relatively enlarged manner in some cases so as to make the drawings easy to see. In addition, even when a plan view and a cross-sectional view correspond to each other, a specific portion is shown in a relatively enlarged manner in some cases so as to make the drawings easy to see. Hatching is omitted even in a cross-sectional view so as to make the drawings easy to see, and hatching is used even in a plan view so as to make the drawings easy to see.

Also, when mentioning "substrate" simply, unless otherwise specified, the "substrate" includes not only a substrate made of single crystal silicon carbide (SiC) and a substrate made of single crystal silicon (Si) but also a substrate having an epitaxial layer formed on a main surface of a substrate made of single crystal silicon carbide (SiC) or a substrate made of single crystal silicon (Si).

In addition, unless otherwise specified, a numerical sequence (orientation index) enclosed by brackets < > indicates a crystal orientation, and is described by, for example, four orientation indices like <11-20> direction in hexagonal single crystal. Herein, a minus sign indicates that the orientation index immediately after the sign is an orientation having a minus component, and <11-20> means that the orientation index 2 is in the minus direction. Further, a numerical sequence (surface index) enclosed by round brackets ( ) indicates a crystal surface, and is described by, for example, four surface indices like (0001) surface in hexagonal single crystal.

Hereinafter, embodiments of the present invention will be described in detail with reference to drawings.

(Advantages of Super-Junction Structure)

The power MOSFET according to the present embodiment has the super-junction structure. The power MOSFET having the super-junction structure like this can obtain the advantages described below.

In the power MOSFET, the withstand voltage is secured by lowering the impurity concentration of the substrate and extending the depletion layer formed in the substrate in an off state. Therefore, in order to realize a high withstand voltage, it is necessary to increase the thickness of the substrate with a low impurity concentration. On the other hand, if the thickness of the substrate with a low impurity concentration is increased, the on-resistance of the power MOSFET becomes high. Namely, in the power MOSFET, there is a trade-off relationship between the improvement in withstand voltage and the reduction in on-resistance.

In the power MOSFET of the present embodiment, a super-junction structure including a p-type column region and an n-type column region that are cyclically arranged is formed in a substrate. The super-junction structure is generally constituted of a plurality of p-type column regions formed at regular intervals in an n-type substrate and a plurality of n-type column regions each made of the n-type substrate between adjacent p-type column regions.

In this power MOSFET having the super-junction structure, the depletion layer extends also in a lateral direction from a pn junction formed in a boundary region between the p-type column region and the n-type column region in an off state. Therefore, even if the impurity concentration of the n-type column region serving as a current path is increased, the depletion layers extending in an internal direction of the n-type column region sandwiched between the two boundary regions are connected, so that the entire n-type column region is likely to be depleted. Accordingly, the entire n-type column region is depleted in an OFF state, and thus the withstand voltage can be secured. In other words, in the power MOSFET having the super-junction structure, the impurity concentration of the n-type column region serving as the current path can be increased, and the entire n-type column region can be depleted. As a result, in the power MOSFET having the super-junction structure, the on-resistance can be reduced while securing the high withstand voltage.

(Advantage of Trench Backfill Method)

In the super-junction structure, for example, it is effective that an interval between the adjacent p-type column regions is narrowed to reduce the width of the n-type column region from the viewpoint of reducing the on-resistance of the power MOSFET. This is because it is desirable to increase the n-type impurity concentration of the n-type column region serving as the current path from the viewpoint of reducing the on-resistance. Namely, when the n-type impurity concentration of the n-type column region is increased in order to reduce the on-resistance, the extension of the depletion layer to the n-type column region is reduced, and it is thus necessary to reduce the width of the n-type column region for the depletion of the entire n-type column region.

Therefore, in consideration of securing the withstand voltage while increasing the n-type impurity concentration of the n-type column region to reduce the on-resistance, it is necessary that the interval between the adjacent p-type column regions is narrowed to reduce the width of the n-type column region.

As a typical method for forming the super-junction structure, the "trench backfill method" has been known. In the trench backfill method, the p-type column region is formed by the filling epitaxial growth method to the trench formed in the substrate. Therefore, the formation accuracy of the p-type column region is determined by the formation accuracy of the trench. Since the trench is generally formed by the photolithography technique and the dry etching technique, the p-type column regions can be formed with high accuracy and the interval between the adjacent p-type column regions can be narrowed in the trench backfill method.

As another method for forming the super-junction structure, the "multi-epitaxial method" has been known. However, in the multi-epitaxial method, the p-type column region is formed by the ion implantation method. Therefore, the multi-step ion implantation is required for forming the deep p-type column region in the substrate, and there is an issue of the increase in the number of ion implantations.

Therefore, the trench backfill method is adopted in the present embodiment. Hereinafter, the power MOSFET having the super-junction structure formed by the trench backfill method will be described.

(Detailed Description of Defects Accompanying Filling Epitaxial Growth Method)

The semiconductor device including the power MOSFET having the super-junction structure according to the present embodiment is manufactured on a substrate made of single crystal silicon carbide (SiC) in a wafer shape (hereinafter, referred to as SiC single crystal substrate). Specifically, the p-type column region and the n-type column region constituting the super-junction structure are alternatively arranged in an epitaxial layer formed on a main surface of an SiC single crystal substrate. The SiC single crystal substrate generally has a main surface in which (0001) surface is tilted by 4° in <11-20> direction, and the SiC single crystal substrate is manufactured such that the orientation flat and the <11-20> direction are approximately parallel to each other. Therefore, the epitaxial layer formed on the main surface of the SiC single crystal substrate by the epitaxial growth method also has the same crystal structure as the SiC single crystal substrate.

Figure 18:
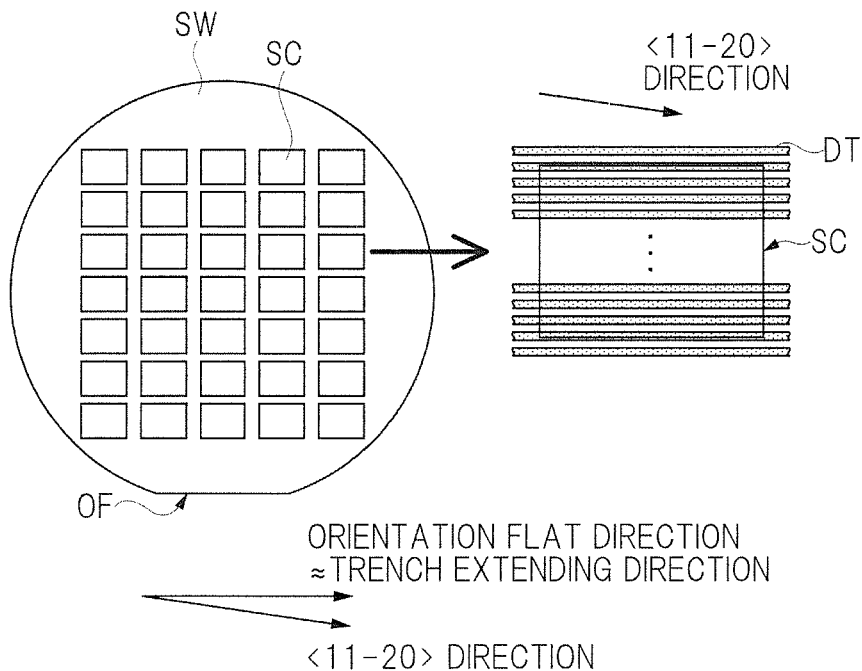
FIG. 18 is a plan view showing a first comparative example of a layout of a plurality of semiconductor chips formed on an SiC single crystal wafer examined in advance of the present invention by the inventors of the present invention.

However, as shown in FIG. 18, for example, the direction of an orientation flat OF is not parallel to the <11-20> direction due to variations in process conditions in the manufacture of an SiC single crystal substrate SW and an angle error between the direction of the orientation flat OF and the <11-20> direction becomes larger than ±1° in some cases. In such a case, if a plurality of trenches (referred to also as groove) DT constituting the super-junction structure in each of semiconductor chips SC are formed to be approximately parallel to the direction of the orientation flat OF, an angle error between the extending direction (referred to also as longitudinal direction) of the trench DT and the <11-20> direction becomes larger than ±1°.

Figure 19:
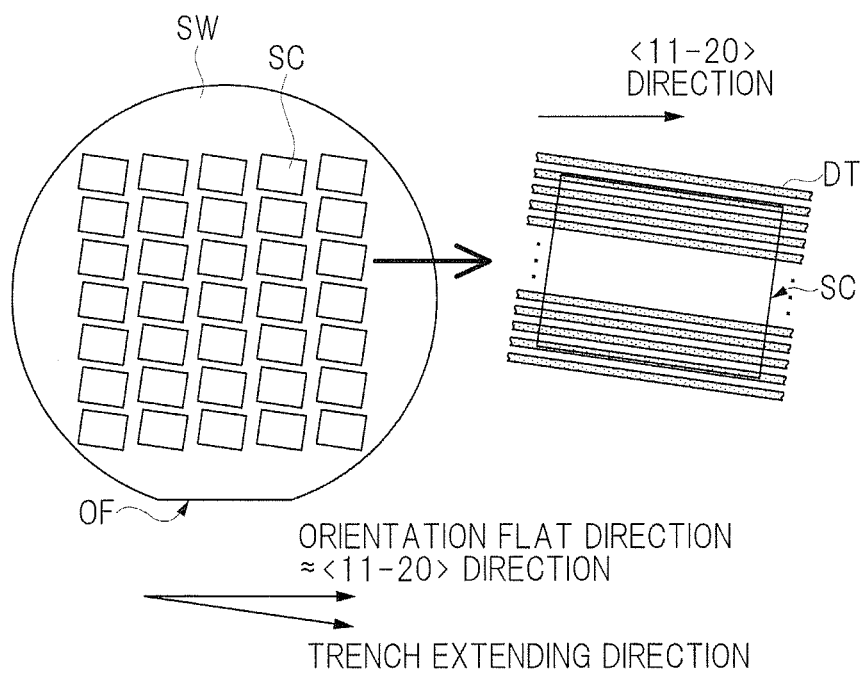
FIG. 19 is a plan view showing a second comparative example of a layout of a plurality of semiconductor chips formed on an SiC single crystal wafer examined in advance of the present invention by the inventors of the present invention.

Also, as shown in FIG. 19, for example, even when an angle error between the direction of the orientation flat OF and the <11-20> direction is smaller than ±1°, the extending direction of the plurality of trenches DT formed in each of the semiconductor chips SC deviates from the direction of the orientation flat OF due to variations in process conditions in the manufacture of thereof in some cases. In such a case, an angle error between the extending direction of the trench DT and the <11-20> direction becomes larger than ±1° in some cases.

The examination by the inventors of the present invention has revealed that, when the angle error between the extending direction of the trench DT and the <11-20> direction becomes larger than ±1°, it becomes difficult to backfill the inside of the trench DT with a semiconductor layer by the filling epitaxial growth method.

Figure 20:
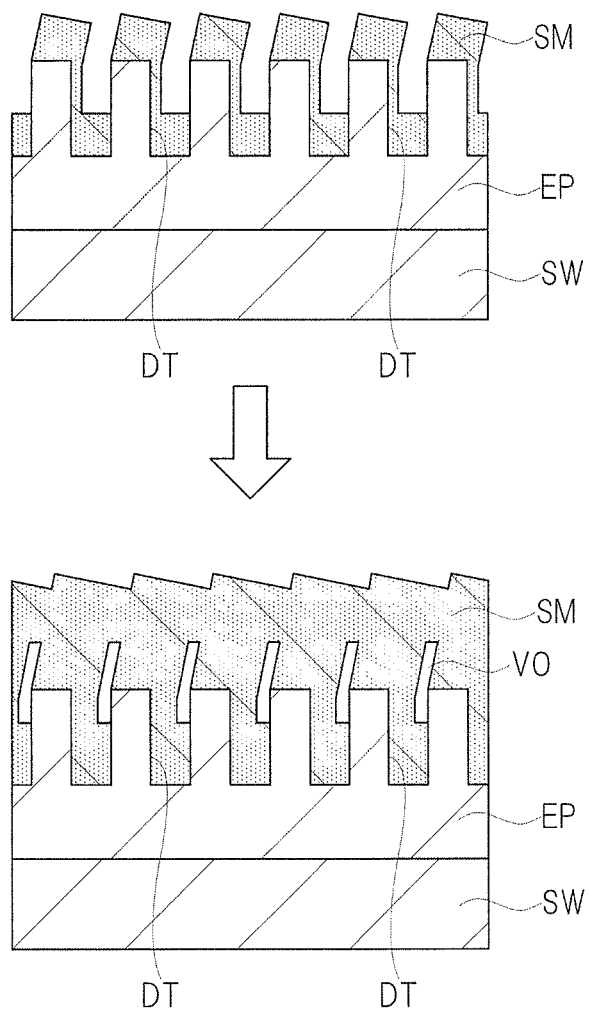
FIG. 20 is a schematic diagram for describing an example of backfilling of a plurality of trenches formed in a semiconductor device examined in advance of the present invention by the inventors of the present invention.

FIG. 20 is a schematic diagram for describing an example of backfilling by the filling epitaxial growth method in the case where the angle error between the extending direction of the trench DT and the <11-20> direction is larger than ±1°. The epitaxial layer EP is formed on the main surface of the SiC single crystal substrate SW, and the plurality of trenches DT are formed in the epitaxial layer EP so as to extend in one direction. The angle error between the extending direction of the trench DT and the <11-20> direction is, for example, about ±5°.

In an initial stage of the epitaxial growth, a semiconductor layer SM, for example, an SiC layer grows from a bottom of the trench DT and an upper surface of a convex portion of the epitaxial layer EP and the inside of the trench DT is gradually backfilled. However, since the growth direction of the semiconductor layer SM is gradually tilted, as the epitaxial growth progresses, the upper portion of the trench DT and both end portions in the extending direction are closed, and the vacancies (referred to also as voids) VO are formed in the trench DT. When the depth of the trench DT is 5 μm or larger, in particular, 10 μm or larger, the defect like this accompanying the filling epitaxial growth method appears conspicuously.

(Knowledges that LED to Present Invention)

The knowledges that led to the present invention will be described below in detail.

(1) Experimental Results on Crystal Growth of SiC Layer that Backfills Inside of Trench FIGS. 23(a) to 23(i) are cross-sectional SEM images of a plurality of trenches that are formed in a substrate with various tilt angles of an extending direction with respect to the <11-20> direction and then are backfilled with a crystal layer. The plurality of trenches are formed in the substrate so as to intentionally have tilt variations with respect to the <11-20> direction, by using a photomask in which a plurality of patterns with different tilt angles with respect to the <11-20> direction are formed. FIGS. 23(a) to 23(i) each show the state of trench filling in the case where the tilt angle of the pattern with respect to the <11-20> direction is changed in increments of 0.5° in the range of −2.0° to +2.0° on the photomask.

FIGS. 23(a) to 23(i) each show a tilt angle θtrench of the pattern on the photomask with respect to the <11-20> direction, and FIG. 23(a) shows "−2.0°", for example. Note that an angle "(−1.5°)" written in brackets in FIG. 23(a) is an "estimated actual angle" described later. Also, the pattern tilted toward the <−1100> direction orthogonal to the <11-20> direction is referred to as the pattern tilted to a plus side, and the pattern tilted toward the direction opposite to the <−1100> direction (that is, <1-100>) is referred to as the pattern tilted to a minus side.

As experimental conditions, after forming the plurality of trenches in the 4 degrees off-axis 4H—SiC substrate with respect to the <11-20> direction, the insides of the trenches are backfilled by the crystal growth of an SiC layer. The photomask for forming the trench is aligned by exposure apparatus such that the orientation flat of the substrate used for the experiment and the pattern with θtrench=0° are parallel to each other.

The substrate used in the experiment is manufactured such that the orientation flat corresponds to the <11-20> direction, but an angle error between the orientation flat of the substrate in specifications and the <11-20> direction is within ±5°. The trench is formed by the ICP (Inductively Coupled Plasma) etching method, the depth of the trench is 22 μm to 25 μm, and the width thereof is 2.25 μm to 2.5 μm. Also, the size of the convex portion of the substrate corresponding to the space that separates the adjacent trenches is 2.25 μm to 2.5 μm. In addition, the other experimental conditions that are not mentioned here such as backfill crystal growth of the SiC layer are similar to those described later in <<Manufacturing Method of Semiconductor Device>> of the first embodiment.

In the experimental results, the best result is obtained in the pattern of θtrench=−0.5° shown in FIG. 23(d), and the SiC layer is embedded in the trench in a favorable state while the trench maintains the verticality. On the other hand, in the cases of FIGS. 23(c), 23(b), and 23(a), that is, in the cases where θtrench is tilted to the minus side, the SiC layer tilted toward the left side grows from the side surface of the trench, and covers the upper portion of the trench as the angle becomes larger. Also, in the cases of FIGS. 23(e), 23(f), 23(g), 23(h), and 23(i), that is, in the cases where θtrench is tilted to the plus side, the SiC layer tilted toward the right side grows from the side surface of the trench, and covers the upper portion of the trench as the angle becomes larger. According to the results described above, the following knowledges can be obtained.

(Knowledge A)

When θtrench increases and the upper portion of the trench is covered with the SiC layer formed by crystal growth, the source gas is hard to be supplied to the inside of the trench, so that the backfill crystal growth of the SiC layer inside the trench is inhibited.

(Knowledge B)

The approximately vertical crystal growth of the SiC layer can be achieved in the pattern of θtrench=−0.5°, and the orientation flat of the substrate used in the experiment is formed to deviate from the strict <11-20> direction by about 0.5°. Therefore, it is possible to assign the "estimated actual angle between the extending direction of the trench and the <11-20> direction specific to crystal" written in the brackets in FIGS. 23(a) to 23(i). In this experiment, FIG. 23(d) almost corresponds to the estimated actual angle of 0°.

(2) Relationship Between Tilt Angle θTrench of Pattern on Photomask with Respect to <11-20> Direction and Tilt Angle θMesa of SiC Layer Grown on Side Surface of Upper Portion of Trench FIG. 24 is a graph chart showing a relationship between a tilt angle θtrench of the pattern on the photomask with respect to the <11-20> direction and a tilt angle θmesa of the SiC layer grown on the side surface of the upper portion of the trench obtained from FIG. 23. It can be seen that θtrench and θmesa have a proportional relationship approximated by a straight line. From this chart, the following knowledge is obtained.

(Knowledge C)

θtrench and θmesa have a proportional relationship approximated by a straight line, and the slope thereof is 13.

(3) Model for Examining Relationship Between Trench Shape and Growth Inhibition of Crystal Layer in Trench FIGS. 25(a), 25(b), and 25(c) are schematic diagrams each showing a model for considering a relationship between trench dimensions and a state where the crystal layer closes the trench, in the case where the crystal layer grows in an obliquely tilted manner from the side surface of the upper portion of the trench.

FIG. 25(a) shows a first model in which crystal growth with a tilt angle Q1 starts from the upper portion h/2 of the side surface of the trench with the height h and the width w and the trench is closed. This corresponds to the case where the SiC layer grows in a tilted manner from the upper half of the side surface of the trench in the experimental result shown in FIG. 23. Therefore, the model shown in FIG. 25(a) is the minimum condition required for avoiding the growth inhibition of the crystal layer inside the trench. The maximum tilt angle Q1 allowable in the model shown in FIG. 25(a) is represented by the following (Expression 1).

$$Q1 = \arctan(2w/h) \quad \text{(Expression 1)}$$

FIG. 25(b) shows a second model for effectively reducing the growth inhibition of the crystal layer inside the trench. Namely, as a standard in this model, the crystal layer with a tilt angle Q2 grows from the upper portion h/2 of the side surface of the trench and the crystal growth is suppressed to the half w/2 of the width of the trench so as not to close the entrance of the trench. The maximum tilt angle Q2 allowable in the model shown in FIG. 25(b) is represented by the following (Expression 2).

$$Q2 = \arctan(w/h) \quad \text{(Expression 2)}$$

FIG. 25(c) shows a more desirable third model. Namely, as a standard in this model, the crystal layer with a tilt angle Q3 grows from the upper portion h/2 of the side surface of the trench and the crystal growth is suppressed to the quarter w/4 of the width of the trench with further margin so as not to close the entrance of the trench. The maximum tilt angle Q3 allowable in the model shown in FIG. 25(c) is represented by the following (Expression 3).

$$Q3 = \arctan(w/2h) \quad \text{(Expression 3)}$$

Namely, in order to avoid the growth inhibition of the crystal layer inside the trench, the growth angle of the crystal layer needs to be at least smaller than the angle Q1 of (Expression 1), is preferably smaller than the angle Q2 of (Expression 2), and is more preferably smaller than the angle Q3 of (Expression 3).

(4) Allowable Angle Error θ of Extending Direction of Trench with Respect to <11-20> Direction Calculated from Models Shown in FIG. 25

FIG. 26 is a graph chart showing an allowable angle error between the extending direction of the trench and the <11-20> direction calculated from the models shown in FIG. 25 and (knowledge C) above. Namely, since Q1 of (Expression 1), Q2 of (Expression 2), and Q3 of (Expression 3) correspond to θmesa of (Knowledge C), the allowable angle error θ of the extending direction of the trench with respect to the <11-20> direction can be obtained as the value corresponding to the θtrench if the slope 13 obtained from the experimental result of FIG. 24 is used. Thus, the following knowledge can be obtained.

(Knowledge D)

In order to avoid the growth inhibition of the crystal layer inside the trench, the angle error θ between the extending direction of the trench and the <11-20> direction needs to be at least smaller than the angle of the following (Expression 4).

$$\theta = Q1/13 = \{\arctan(2w/h)\}/13 \quad \text{(Expression 4)}$$

The angle error θ between the extending direction of the trench and the <11-20> direction is preferably smaller than the angle of the following (Expression 5).

$$\theta = Q2/13 = \{\arctan(w/h)\}/13 \quad \text{(Expression 5)}$$

The angle error θ between the extending direction of the trench and the <11-20> direction is more preferably smaller than the angle of the following (Expression 6).

$$\theta = Q3/13 = \{\arctan(w/2h)\}/13 \quad \text{(Expression 6)}$$

Since the angle error θ between the extending direction of the trench and the <11-20> direction has values on both of the plus side and the minus side as the allowable angle error, the angle error within ±0 represented by (Expression 4), (Expression 5), and (Expression 6) above is the knowledge for effectively reducing the growth inhibition of the crystal layer inside the trench.

FIG. 26 shows the calculation results of (Expression 4), (Expression 5), and (Expression 6) above. The vertical axis of FIG. 26 represents the angle error θ of the extending direction of the trench with respect to the <11-20> direction allowable for the three models shown in FIGS. 25(a), 25(b), and 25(c). The first horizontal axis represents the height h when the width w of the trench is set to 2 μm and shows the range of 0 μm to 40 μm. The second horizontal axis represents the aspect ratio (Ratio=h/w) which is a dimensionless value and shows the range of 0 to 20.

In FIG. 26, when the aspect ratio is smaller than 5, the allowable value of the angle error θ of the extending direction respect to the <11-20> direction sharply increases due to the characteristics of function. Therefore, in the region with the relatively small aspect ratio (0 to 5), the margin of the angle error θ is relatively large.

On the other hand, when the aspect ratio is equal to or larger than 5, the allowable value of the angle error θ does not change sharply and gradually decreases as the aspect ratio increases. Therefore, the management of the angle error θ is important in the range of the aspect ratio of 5 or more. Further, when the aspect ratio becomes equal to or larger than 10, since the characteristics of gradually reducing and approximated by a curved line and an almost straight line also appear and the value of the angle error θ itself becomes small, the management of the angle error θ is more important. In other words, as the applicable range of the present invention, the remarkable effect can be expected in the range of the aspect ratio of 5 or more. Further, the more remarkable effect can be expected in the range of the aspect ratio of 10 or more.

(5) Relationship Between Tilt Angle θTrench of Pattern on Photomask with Respect to <11-20> Direction and Crystal Growth Rate at Trench Bottom FIG. 27 summarizes the experimental results shown in FIG. 23, and is a graph chart showing a relationship between the tilt angle θtrench of the pattern on the photomask with respect to the <11-20> direction and a crystal growth rate at a trench bottom (upper plots in the graph). In addition, FIG. 27 shows a crystal growth rate at a mesa top (upper surface of convex portion of substrate) (lower plots in the graph). Herein, the mesa means a convex portion. When a plurality of trenches are formed in the substrate, convex portions of the substrate each serving as a spacer to separate adjacent trenches are formed, and the convex portion is referred to as mesa. The curved line that connects the points of the experimental results shown in FIG. 27 is Gaussian fitting curve.

It can be seen from FIG. 27 that the crystal growth rate at the trench bottom is sensitively affected by the θtrench. Namely, it is presumed that the mechanism in which the entrance at the uppermost portion of the trench is narrowed due to the crystal layer grown in a tilted manner, so that the source gas of the crystal growth is hard to be supplied to the trench bottom is working.

Note that, since the crystal growth at the mesa top occurs in the vicinity of the upper surface of the substrate and is less likely to be affected by the restriction of the supply of the source gas, the crystal growth rate at the mesa top changes relatively gently with respect to the θtrench. Even in this case, however, the crystal growth rate at the mesa top decreases in the pattern of θtrench=−0.5°, and this supports the fact that the source gas is efficiently supplied to the trench bottom from the opposite viewpoint.

Incidentally, when (Expression 4), (Expression 5), and (Expression 6) are more generalized and formulated, the following (Expression 7) is obtained.

$$\theta = \{\arctan\{k \times (w/h)\}\}/13 \quad \text{(Expression 7)}$$

Herein, k is defined as "alignment margin coefficient" as a matter of convenience, and k is a coefficient smaller than 2. (Expression 4), (Expression 5), and (Expression 6) are specific cases corresponding to k=2, k=1, and k=½, respectively. As k becomes smaller than 2, the tilted growth of the crystal layer shown in FIG. 23 is suppressed, and the degree of completion of the backfilling of the crystal layer inside the trench is improved. Note that the theoretical minimum value of k is 0, but 0=0 at this time. Since it is difficult to realize k=0 in an actual manufacturing process, cost of the semiconductor device can be optimized by selecting k in consideration of the balance between the manufacturing yield and the manufacturing cost (manufacturing margin).

When (Expression 7) is solved for k in reverse, the following (Expression 8) is obtained.

$$k = (h/w) \times \tan(13 \times \theta) \quad \text{(Expression 8)}$$

(6) Calculation Result of Alignment Margin Coefficient k

FIG. 28 shows the alignment margin coefficient k calculated by reading the angle error θ from the width of θtrench at a predetermined height in the fitting curve of the crystal growth rate at the trench bottom shown in FIG. 27 and substituting the angle error θ into (Expression 8). The height equivalent to the change of the crystal growth rate at the trench bottom is referred to as "height position (Level)", and is defined as a value of 0% to 100% when the tail (θtrench=−2.0° or +1.0°) of the Gaussian curve is set to 0% (crystal growth rate: GR=2.38 μm/h) and the peak (θtrench=)−0.46° of the Gaussian curve is set to 100%.

In FIG. 28, the angle error e is obtained by reading the width (L-width) of θtrench of the Gaussian curve at the height position (Level) of 50%, 80% and 90% and halving the width (L-width). Under the experimental conditions shown in FIG. 23, since the depth h of the trench is 22 μm to 25 μm and the width w is 2.25 μm to 2.5 μm, the center values of h=23.5 μm and w=2.385 μm are used when calculating k using (Expression 8).

In the following, the meaning of "height position (Level)" in the crystal growth of the trench backfill before the trench entrance is completely closed will be considered. In a simplified model, the source gas supplied for the trench backfill is considered to be distributed into the following three portions.

(a) Portion contributing to crystal growth that occurs at the trench bottom: $A1+A2(\theta)$ (b) Portion contributing to crystal growth that occurs at the mesa top: $B1+B2(\theta)$ (c) Portion contributing to crystal growth that occurs on the side surface of the trench: $C1+C2(\theta)$ This is because the experimental results shown in FIGS. 23 and 27 suggest the presence of the constant part that is independent of θtrench of A1, B1, and C1 and the presence of the variable part that is dependent on θtrench of $A2(\theta)$, $B2(\theta)$, and $C2(\theta)$.

The above (a) is a portion to be the object of the present invention, and it is desirable to maximize the contribution of the source gas to this portion. Since the above (b) is a crystal growth that occurs vertically upward from the mesa top, it is not directly harmful to the backfill of the trench bottom, but it is desirable to reduce it as much as possible. The above (c) is a portion that hinders the object of the present invention, and it is desirable to minimize the contribution of the source gas to this portion.

Assuming that the supply of the source gas is constant and the total sum of the above (a), (b), and (c) is always constant, the following expression is obtained.

$$A1+A2(\theta)+B1+B2(\theta)+C1+C2(\theta)=\text{const} \quad \text{(Expression 9)}$$

Herein, since A1, B1, and C1 are constants, they are transposed to the right side and are summarized as a new constant const', so that the following expression is obtained.

$$A2(\theta)+B2(\theta)+C2(\theta)=\text{const'} \quad \text{(Expression 10)}$$

When the contribution of the source gas to $A2(\theta)$ is 100% in (Expression 10), the remaining $B2(\theta)$ and $C2(\theta)$ becomes 0%. This approximately corresponds to θtrench=0.5° shown in FIG. 27, and corresponds to 100% as the height position (Level). In addition, this is a state in which the above (a) can be maximized and the above (b) and (c) can be minimized.

In contrast, when the contribution to $A2(\theta)$ is 0% in (Equation 10), the remaining $B2(\theta)+C2(\theta)$ becomes 100%. This approximately corresponds to θtrench=−2.0° or θtrench=+1.0° shown in FIG. 27 and corresponds to 0% as the height position (Level). Also, this is a state in which the above (a) is minimized and the above (b) and (c) are maximized. From the foregoing, the height position (Level) can be understood as a parameter that approximately expresses the efficiency of crystal growth to the trench bottom. From the above results, the following knowledge is obtained.

(Knowledge E)

The angle error θ between the extending direction of the trench and the crystal orientation (for example, <11-20> direction) for reducing the growth inhibition of the crystal layer inside the trench having the height h and the width w is generally represented by at least the following expression ((Expression 7) shown again)).

$$\theta = \{\arctan \{k \times (w/h)\}\}/13$$

Herein, k is defined as the alignment margin coefficient and needs to be a value smaller than 2. In comparison with the case where the crystal growth rate at the trench bottom is saturated (0%), the crystal growth rate which is more efficient by 50% or more is secured when k=0.9 or less. Further, the crystal growth rate which is more efficient by 80% or more is secured when k=0.5 or less. More preferably, the crystal growth rate which is more efficient by 90% or more is secured when k=0.3 or less.

The present embodiment provides a novel technical idea capable of improving a manufacturing yield and reliability of a semiconductor device by surely backfilling an inside of a trench with a crystal layer by the filling epitaxial growth method, in a semiconductor device including a power MOSFET having the super-junction structure based on the above-described knowledges that lead to the present invention.

First Embodiment

<<Features and Effects of Semiconductor Device>>

Figure 1:
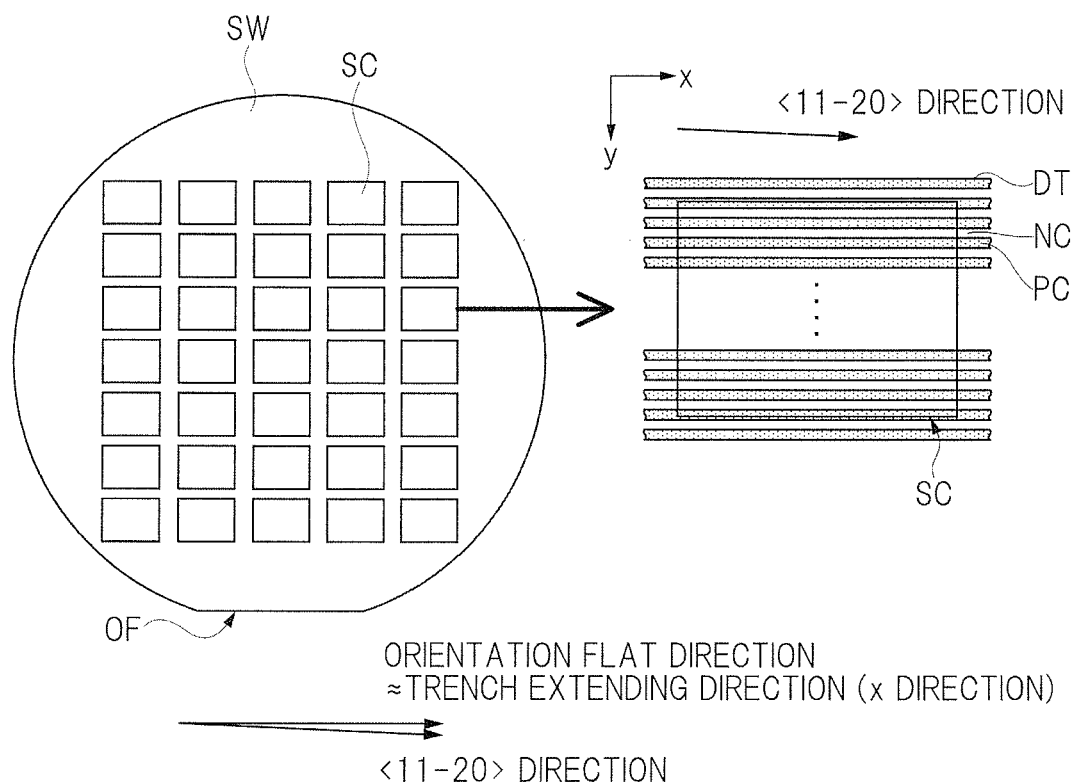
FIG. 1 is a plan view showing a first example of a layout of a plurality of semiconductor chips formed on an SiC single crystal wafer according to a first embodiment.
Figure 2:
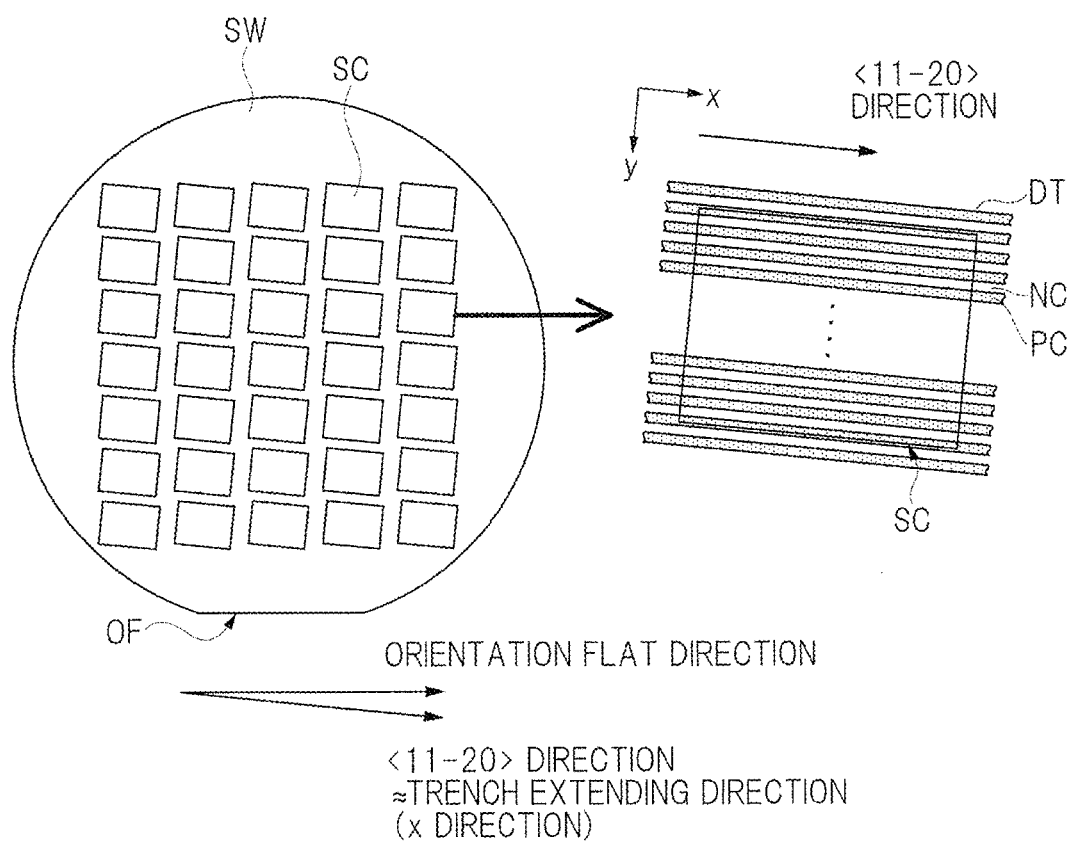
FIG. 2 is a plan view showing a second example of the layout of the plurality of semiconductor chips formed on the SiC single crystal wafer according to the first embodiment.
Figure 3:
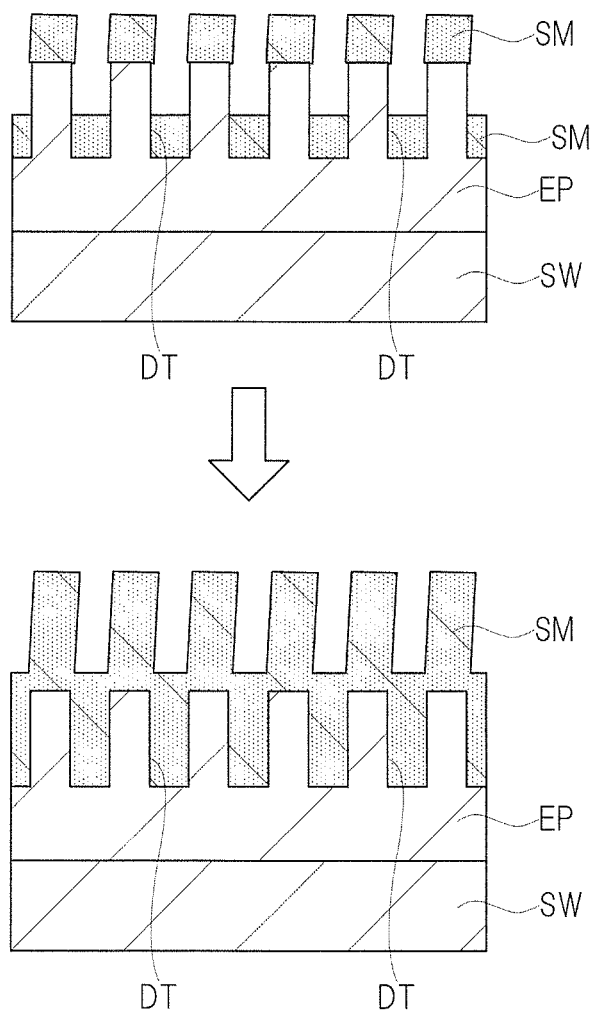
FIG. 3 is a schematic diagram for describing an example of backfilling of a plurality of trenches formed in the semiconductor device according to the first embodiment.

Features and effects of the semiconductor device according to the first embodiment will be described with reference to FIG. 1, FIG. 2, and FIG. 3. FIG. 1 is a plan view showing a first example of a layout of a plurality of semiconductor chips formed on an SiC single crystal wafer according to the first embodiment. FIG. 2 is a plan view showing a second example of the layout of the plurality of semiconductor chips formed on the SiC single crystal wafer according to the first embodiment. FIG. 3 is a schematic diagram for describing an example of backfilling of a plurality of trenches formed in the semiconductor device according to the first embodiment.

First, the first example of the semiconductor device according to the first embodiment will be described with reference to FIG. 1.

As shown in FIG. 1, the semiconductor device including the power MOSFET having the super-junction structure according to the first embodiment is manufactured on an SiC single crystal substrate SW in a wafer shape for each semiconductor chip SC. Specifically, an epitaxial layer having the same crystal structure as the SiC single crystal substrate SW is formed on a main surface of the SiC single crystal substrate SW, and the super-junction structure in which p-type column regions PC and n-type column regions NC extending in an x direction (first direction) are alternatively arranged in a y direction (second direction) orthogonal to the x direction along the main surface of the SiC single crystal substrate SW is provided in the epitaxial layer. The SiC single crystal substrate SW is made of, for example, 4H polytype hexagonal SiC single crystal (abbreviated as "4H—SiC").

The p-type column regions PC are made of a semiconductor layer (SiC layer) embedded by the filling epitaxial growth method in a plurality of trenches DT formed in the epitaxial layer so as to extend in the x direction and to be spaced apart from each other in the y direction, and each of the n-type column regions NC made of the epitaxial layer is formed between the p-type column regions PC adjacent to each other in the y direction. The semiconductor layer is a crystal layer having the same crystal structure as that of the epitaxial layer, that is, the SiC single crystal substrate SW.

For example, the trench DT has a depth of 5 μm or more, and the trench DT having an aspect ratio of about 10 and a depth of about 20 μm can be exemplified. Further, the trench DT has a tapered shape that becomes narrower as it gets deeper, and the taper angle formed by the bottom surface and the side surface of the trench DT is, for example, about 88° to 90°. The taper angle may be 80° to 90° (80° or more to 90° or less), more preferably 85° to 90°, and most preferably 88° to 90°.

In the first example of the semiconductor device, the SiC single crystal substrate SW has the main surface whose (0001) surface is tilted by 4° in the <11-20> direction, and the angle error between the orientation flat OF and the <11-20> direction is within ±θ. Herein, as described above in (Knowledge E), θ is determined by $\{\arctan \{k \times (w/h)\}\}/13$ for the trench having the height h and the width w. Herein, k is at least smaller than 2, preferably 0.9 or less, more preferably 0.5 or less, and still more preferably 0.3 or less. As an example of the value within ±θ, a value within ±1° (−1° or more and 1° or less) can be recited as a typical value.

Further, the plurality of trenches DT are formed such that the extending direction (x direction) of the plurality of trenches DT formed in the epitaxial layer and the direction of the orientation flat OF of the SiC single crystal substrate SW are the same. Therefore, the angle error between the extending direction (x direction) of the trench DT and the <11-20> direction is within ±θ. Note that the same direction mentioned here does not mean completely the same direction, but means substantially the same direction or approximately the same direction, and includes a certain range taking variations into account.

Next, the second example of the semiconductor device according to the first embodiment will be described with reference to FIG. 2.

As shown in FIG. 2, in the second example of the semiconductor device, the SiC single crystal substrate SW has a main surface whose (0001) surface is tilted by 4° in the <11-20> direction, and the angle error between the orientation flat OF and the <11-20> direction is larger than ±0 mentioned above. Further, the plurality of trenches DT are formed such that the extending direction (x direction) of the plurality of trenches DT formed in the epitaxial layer and the <11-20> direction are the same. Therefore, the angle error between the extending direction (x direction) of the trench DT and the <11-20> direction is within ±0.

FIG. 3 is a schematic diagram for describing an example of backfilling by the filling epitaxial growth method in the first example and the second example of the semiconductor device according to the first embodiment, that is, in the case where the angle error between the extending direction (x direction) of the trench DT and the <11-20> direction is within ±θ.

In an initial stage of the epitaxial growth, the semiconductor layer SM grows from the bottom of the trench DT and the upper surface of the convex portion of the epitaxial layer EP and the inside of the trench DT is gradually backfilled. Further, since the angle error between the extending direction (x direction) of the trench DT and the <11-20> direction is within ±θ, the tilt of the growth direction of the semiconductor layer SM is small even when the epitaxial growth proceeds, and the inside of the trench DT can be backfilled with the semiconductor layer SM before the upper portion and both end portions in the extending direction of the trench DT are closed.

Accordingly, since voids are less likely to be formed in the trench DT, the reduction in the manufacturing yield due to the backfill failure can be prevented. Also, the reliability of the semiconductor device can be improved.

<<Configuration of Semiconductor Device>>

Figure 4:
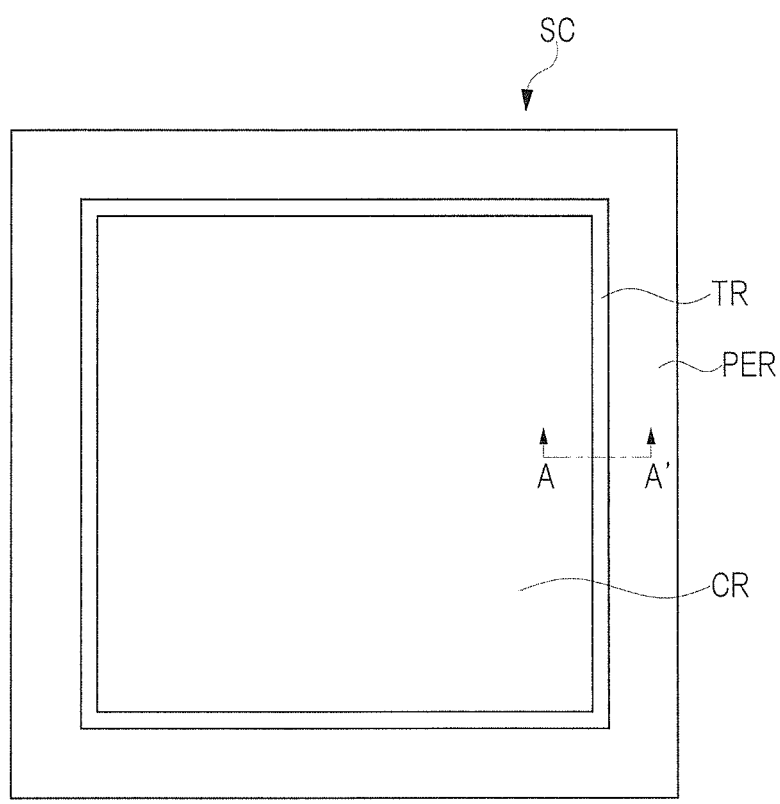
FIG. 4 is a plan view showing a configuration of the semiconductor device according to the first embodiment.
Figure 5:
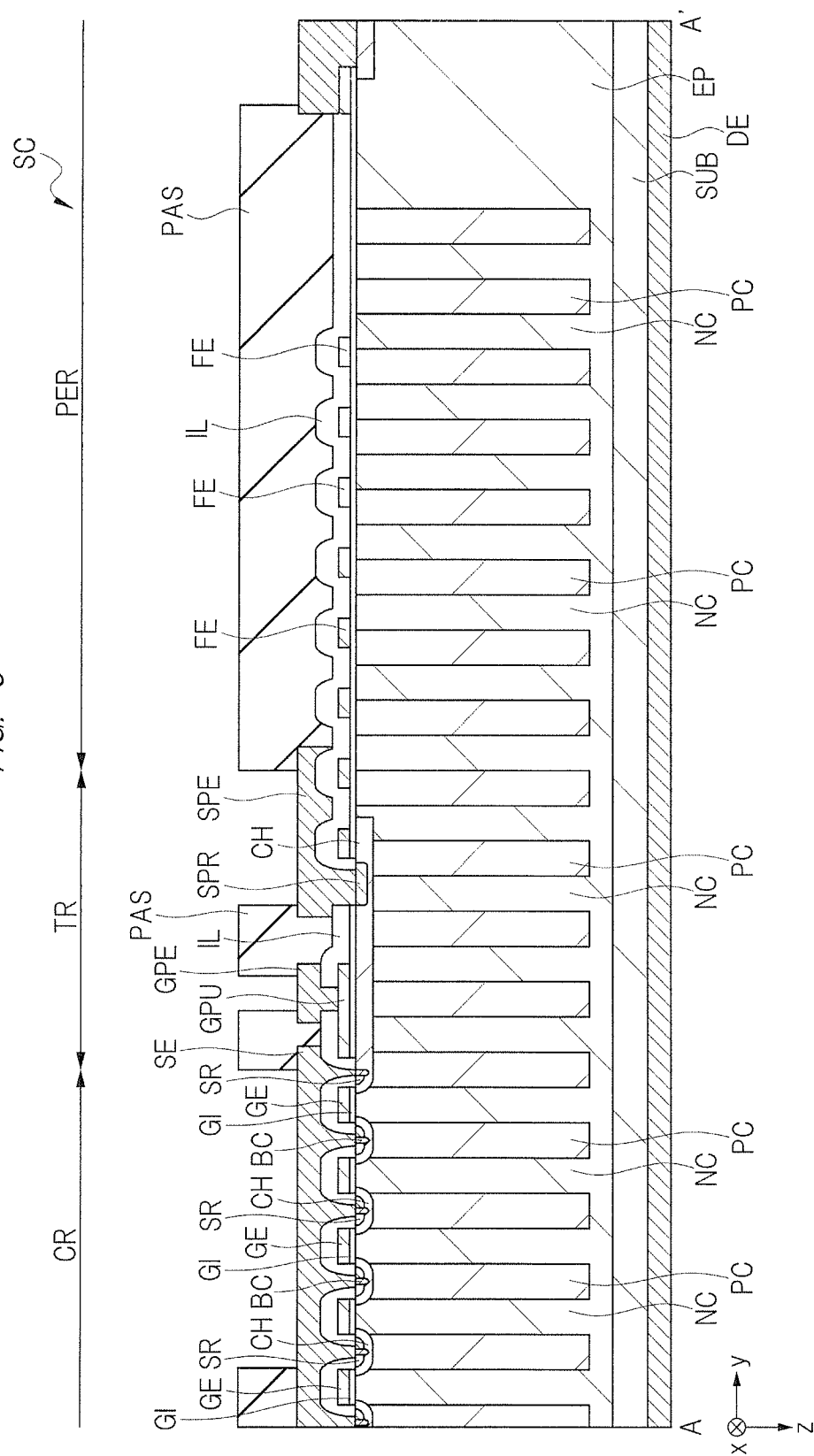
FIG. 5 is a cross-sectional view (cross-sectional view taken along a line A-A' in FIG. 4) showing the configuration of the semiconductor device according to the first embodiment.

The semiconductor device according to the first embodiment will be described with reference to FIG. 4 and FIG. 5. FIG. 4 is a plan view showing the configuration of the semiconductor device according to the first embodiment. FIG. 5 is a cross-sectional view taken along a line A-A' in FIG. 4.

As shown in FIG. 4, for example, the semiconductor chip SC according to the first embodiment has a rectangular shape, and includes a cell region (referred to also as active portion) CR, a transition region TR, and a peripheral region (referred to as peripheral portion) PER. The transition region TR is arranged so as to surround the outside of the cell region CR, and the peripheral region PER is arranged so as to surround the transition region TR. In other words, the cell region CR is arranged in an inner region surrounded by the peripheral region PER via the transition region TR.

In the cell region CR, for example, a plurality of power MOSFETs having the super-junction structure functioning as, for example, switching elements are formed. On the other hand, in the peripheral region PER, for example, a peripheral structure typified by a bevel structure, a diffusion ring structure, a field ring structure, or a field plate structure that etches the periphery diagonally is formed. These peripheral structures are basically formed on the basis of a design concept that makes avalanche breakdown phenomenon due to electric field concentration less likely to occur.

As described above, in the semiconductor chip SC according to the first embodiment, the plurality of power MOSFETs having the super-junction structure are formed in the inner region including the center region, and the peripheral structure which is the electric field relaxation structure is formed in the outer region surrounding the inner region.

Hereinafter, the structure of each of the cell region CR, the transition region TR, and the peripheral region PER will be described.

(1) Structure of Cell Region CR

As shown in FIG. 5, the cell region CR has the super-junction structure in which the p-type column regions PC and the n-type column regions NC extending in the x direction are alternatively arranged in the y direction orthogonal to the x direction along the main surface of the substrate SUB in the epitaxial layer on the main surface of the substrate SUB. Further, as described above, the angle error between the extending direction (x direction) of the plurality of trenches DT in which the plurality of p-type column regions PC are formed and the <11-20> direction is within ±θ. Herein, θ is determined as described above in (Knowledge E).

In the first embodiment, the cell region CR in which the ratio between the width of the p-type column region PC in the y direction and the width of the n-type column region NC in the y direction is 1:1 is exemplified, but the cell region CR is not limited to this, and the width of the p-type column region PC in the y direction and the width of the n-type column region NC in the y direction may be different from each other.

The specific description will be given below. The epitaxial layer EP is formed on the main surface of the substrate SUB made of silicon carbide (SiC) containing an n-type impurity such as nitrogen (N), phosphorus (P) or arsenic (As). The epitaxial layer EP is made of a semiconductor layer (S layer) containing silicon carbide (SiC), into which an n-type impurity such as nitrogen (N), phosphorus (P) or arsenic (As) is introduced, as a main component, and has the same crystal structure as that of the substrate SUB. The n-type impurity concentration of the epitaxial layer EP is lower than the impurity concentration of the substrate SUB, and is, for example, $3.0 \times 10^{16}/cm^3$.

In addition, the plurality of p-type column regions PC are formed in the epitaxial layer EP so as to be spaced apart from each other in the y direction. Each of the p-type column regions PC is made of a semiconductor layer (SiC layer) into which a p-type impurity such as aluminum (Al) or boron (B) is introduced. The semiconductor layer is a crystal layer having the same crystal structure as the epitaxial layer EP, and the p-type impurity concentration of the p-type column region PC is, for example, $3.0 \times 10^{16}/cm^3$. Also, a part of the epitaxial layer EP sandwiched between the adjacent p-type column regions PC serves as the n-type column region NC. A drain region of the power MOSFET is composed of the epitaxial layer EP including the plurality of n-type column regions NC and the substrate SUB.

Further, an element portion is formed on the upper surface of the epitaxial layer EP in which the super-junction structure is formed.

In the element portion, a channel region CH in contact with the p-type column region PC is formed on the upper surface of the epitaxial layer EP, and a source region SR is formed so as to be enclosed in the channel region CH. At this time, the channel region CH is constituted of a semiconductor region into which a p-type impurity such as aluminum (Al) or boron (B) is introduced, and the source region SR is constituted of a semiconductor region into which an n-type impurity such as nitrogen (N), phosphorus (P) or arsenic (As) is introduced. In addition, a body contact region BC which reaches the channel region CH from the upper surface of the epitaxial layer EP is formed in the center part of the source region SR. The body contact region BC is constituted of a semiconductor region into which a p-type impurity such as aluminum (Al) or boron (B) is introduced, and the impurity concentration of the body contact region BC is higher than the impurity concentration of the channel region CH.

In addition, a gate insulating film GI is formed on the region sandwiched between the adjacent channel regions CH, and a gate electrode GE is formed on the gate insulating film GI. The gate insulating film GI is formed of, for example, a silicon oxide film, but the gate insulating film GI is not limited to this, and may be formed of, for example, a high dielectric constant film having a higher dielectric constant than a silicon oxide film. Further, the gate electrode GE is formed of, for example, a polycrystalline silicon film. This gate electrode GE is formed so as to be aligned with the source region SR. Also, an interlayer insulating film IL made of, for example, silicon oxide is formed so as to cover an upper surface and a side wall of the gate electrode GE.

A source electrode SE is formed over the interlayer insulating film IL which covers the plurality of gate electrodes GE. The source electrode SE is formed of a stacked film of a barrier conductor film made of, for example, titanium tungsten (TiW) and an aluminum (Al) film. Accordingly, the source electrode SE is electrically connected to the source region SR and is electrically connected also to the channel region CH via the body contact region BC.

At this time, the body contact region BC has a function of securing the ohmic contact with the source electrode SE, and the source region SR and the channel region CH are electrically connected at the same potential due to the presence of the body contact region BC.

Therefore, it is possible to suppress the ON operation of the parasitic npn bipolar transistor having the source region SR as an emitter region, the channel region CH as a base region, and the n-type column region NC as a collector region. Namely, the electrical connection between the source region SR and the channel region CH at the same potential means that no potential difference is generated between the emitter region and the base region of the parasitic npn bipolar transistor, and it is thus possible to suppress the ON operation of the parasitic npn bipolar transistor.

A surface protective film PAS made of, for example, silicon oxide is formed so as to partially cover the source electrode SE, and a partial region of the source electrode SE is exposed from the surface protective film PAS. Also, a drain electrode DE made of metal is formed on a back surface (the surface opposite to the main surface on which the epitaxial layer EP is formed) of the substrate SUB.

In the manner described above, the plurality of power MOSFETs having the super-junction structure are formed in the cell region CR.

(2) Structure of Transition Region TR

As shown in FIG. 5, the transition region TR also has the super-junction structure in which the plurality of p-type column regions PC and the plurality of n-type column regions NC made of the epitaxial layer EP are alternately arranged in the y direction. Further, as described above, the angle error between the extending direction (x direction) of the plurality of trenches DT in which the plurality of p-type column regions PC are formed and the <11-20> direction is within ±θ. Herein, θ is determined as described above in (Knowledge E).

The specific description will be given below. As with the cell region CR, the plurality of p-type column regions PC and the plurality of n-type column regions NC are similarly formed also in the transition region TR. Further, a gate lead-out portion GPU formed of the polycrystalline silicon film in the same layer as the gate electrode GE of the cell region CR is formed on the channel region CH via the gate insulating film GI. Further, the interlayer insulating film IL is formed so as to cover an upper surface and a side wall of the gate lead-out portion GPU, and an opening that exposes a part of the upper surface of the gate lead-out portion GPU is formed in a part of the interlayer insulating film IL.

Also, a gate lead-out electrode GPE formed of the stacked film in the same layer as the source electrode SE of the cell region CR is formed on the interlayer insulating film IL including the inside of the opening. Herein, the gate lead-out portion GPU is electrically connected to the plurality of gate electrodes GE, and the gate voltage applied to the gate lead-out electrode GPE is applied to each of the plurality of gate electrodes GE through the gate lead-out portion GPU.

Further, on the upper surface of the epitaxial layer EP, the channel region CH extending from the cell region CR is formed, and a source lead-out region SPR is formed so as to be enclosed in the channel region CH. In addition, the interlayer insulating film IL is formed on the upper surface of the epitaxial layer EP so as to cover the channel region CH, and an opening is formed in the interlayer insulating film IL so as to expose the source lead-out region SPR. Also, a source lead-out electrode SPE formed of the stacked film in the same layer as the gate lead-out electrode GPE is formed on the interlayer insulating film IL including the inside of the opening.

Also in the transition region TR, the surface protective film PAS made of, for example, silicon oxide is formed so as to partially cover the gate lead-out electrode GPE and the source lead-out electrode SPE, and a partial region of the gate lead-out electrode GPE and a partial region of the source lead-out electrode SPE are exposed from the surface protective film PAS.

In the manner described above, the transition structure is formed in the transition region TR.

(3) Structure of Peripheral Region PER

As shown in FIG. 5, the peripheral region PER also has the super-junction structure in which the plurality of p-type column regions PC and the plurality of n-type column regions NC made of the epitaxial layer EP are alternately arranged in the y direction. Further, as described above, the angle error between the extending direction (x direction) of the plurality of trenches DT in which the plurality of p-type column regions PC are formed and the <11-20> direction is within ±θ. Herein, θ is determined as described above in (Knowledge E).

The specific description will be given below. As with the cell region CR, the plurality of p-type column regions PC and the plurality of n-type column regions NC are similarly formed also in the peripheral region PER. Further, a plurality of dummy electrodes FE formed of the polycrystalline silicon film in the same layer as the gate electrode GE of the cell region CR are formed on the upper surface of the epitaxial layer EP via the silicon oxide film in the same layer as the gate insulating film GI of the cell region CR. In addition, the interlayer insulating film IL is formed on the upper surface of the epitaxial layer EP so as to cover an upper surface and a side wall of the plurality of dummy electrodes FE.

Also in the peripheral region PER, the surface protective film PAS made of, for example, silicon oxide is formed.

In the manner described above, the peripheral structure is formed in the peripheral region PER.

<<Manufacturing Method of Semiconductor Device>>

An example of a manufacturing method of a semiconductor device according to the first embodiment will be described with reference to FIGS. 6 to 14. FIGS. 6 to 14 are cross-sectional views showing a manufacturing process of the semiconductor device according to the first embodiment.

Figure 6:
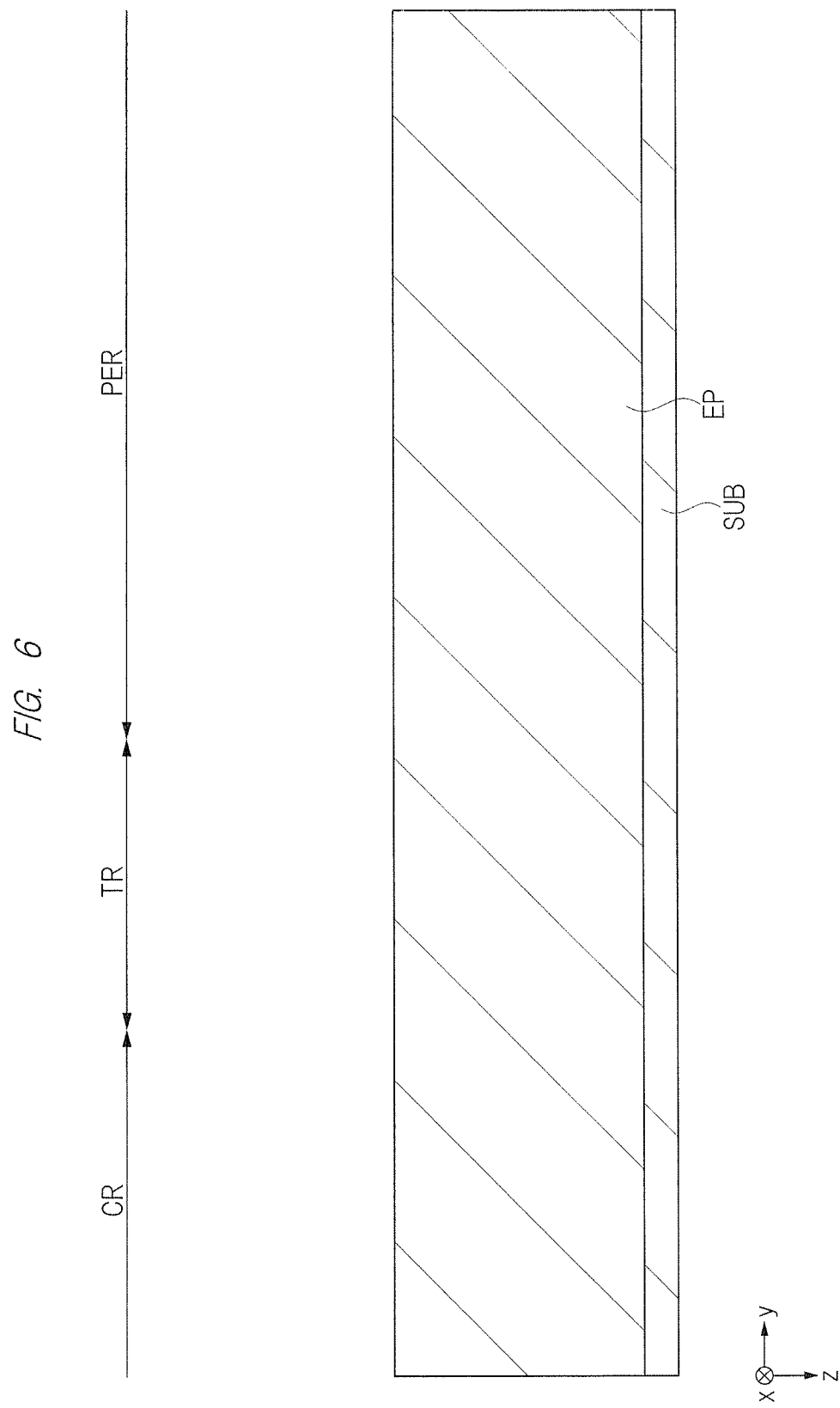
FIG. 6 is a cross-sectional view showing a manufacturing process of the semiconductor device according to the first embodiment.

First, as shown in FIG. 6, the substrate (thin plate having an approximately circular shape in plan view referred to as a wafer) SUB having a main surface (front surface, upper surface) on which a low concentration epitaxial layer EP made of an n-type semiconductor layer is formed is prepared. The substrate SUB is made of, for example, a 4H polytype or 6H polytype hexagonal SiC single crystal, and has the main surface whose (0001) surface is tilted by 4° in the <11-20> direction. Therefore, the epitaxial layer EP is also made of SiC single crystal and has the same crystal structure as the substrate SUB.

In the epitaxial layer EP, an n-type impurity such as nitrogen (N), phosphorus (P) or arsenic (As) is introduced. The n-type impurity concentration of the epitaxial layer EP is, for example, about $3.0 \times 10^{16}/cm^3$, and the thickness of the epitaxial layer EP is, for example, about 20 μm to 30 μm.

Figure 7:
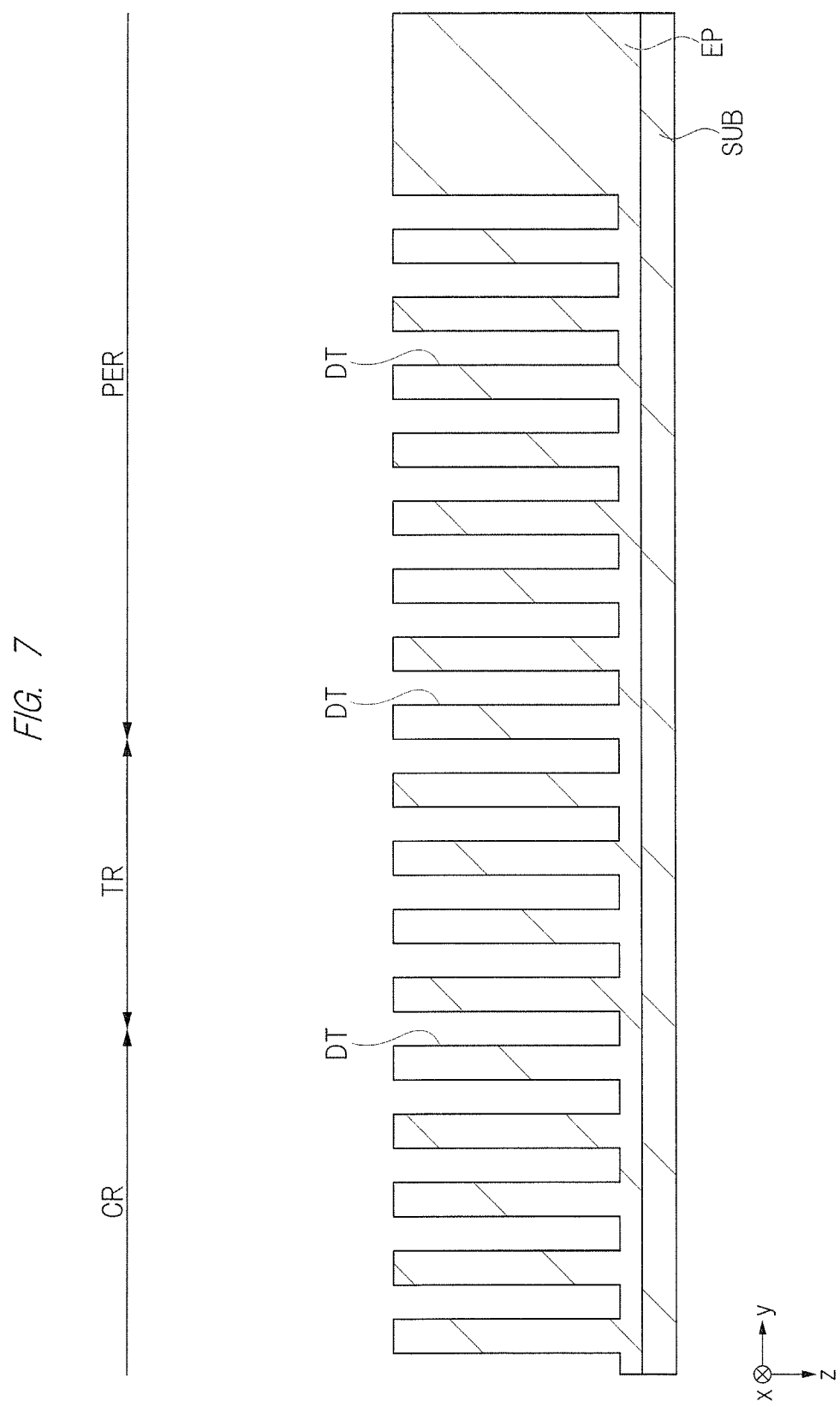
FIG. 7 is a cross-sectional view showing the manufacturing process of the semiconductor device continued from FIG. 6.

Next, as shown in FIG. 7, the plurality of trenches DT extending in the x direction and spaced apart from each other in the y direction are formed in the epitaxial layer EP in the cell region CR, the transition region TR, and the peripheral region PER by, for example, the selective etching method using a pattern made of an insulating material as a hard mask.

For example, the depth of the trench DT from the upper surface of the epitaxial layer EP is 5 μm or more, and the trench DT having an aspect ratio of about 10 and a depth of about 20 μm from the upper surface of the epitaxial layer EP can be exemplified. Further, by setting the taper angle of the trench DT to, for example, about 88° to 90°, the concentration distribution of the semiconductor layer in the backfill region can be improved.

Also, the extending direction (x direction) of the trench DT has an angle error within ±θ with respect to the <11-20> direction. Herein, θ is determined as described above in (Knowledge E).

The method of forming the trench DT differs depending on the specification of the substrate SUB prepared in advance, and the following first method (the first example described with reference to FIG. 1) and second method (the second example described with reference to FIG. 2) can be exemplified.

First method: When preparing the substrate SUB, the substrate SUB in which the angle error between the direction of orientation flat and the <11-20> direction is within ±θ1 (θ1: first angle error) is prepared. The standard specification of the angle error of the SiC substrate that is currently available normally is as large as ±5°. On the other hand, when the deep trench DT having the depth of, for example, larger than 10 μm is backfilled, a specially-designed substrate SUB in which the angle error is within ±0.5° needs to be prepared in the first method.

Next, in the exposure apparatus, exposure for forming an etching pattern of the trench DT is performed using a photomask (reticle). Herein, it is supposed that the angle error (θ2: second angle error) due to the offset between the photomask and the substrate SUB caused by the exposure apparatus is sufficiently small with respect to the first angle error or corrected by preliminary measurement and adjustment of the exposure apparatus. Namely, in the exposure process, it is assumed that the second angle error is sufficiently smaller than the first angle error (θ2<<θ1).

As described above, in the first method, the angle error between the extending direction (x direction) of the trench DT and the <11-20> direction is set within ±θ by preparing the substrate SUB in which the first angle error is within ±θ described above in (Knowledge E).

Second method: In this case, when preparing the substrate SUB, the substrate SUB having standard specification in the angle error between the direction of orientation flat and the <11-20> direction is prepared. For example, the angle error of the SiC substrate having the standard specification that is currently available is within ±5°.

Next, error data is obtained by measuring the angle error (first angle error) between the direction of orientation flat and the <11-20> direction by X-ray diffraction or the like. The measurement of the angle error may be performed by batch processing for each crystal ingot from which the substrate SUB is cut out, or may be performed for each individual piece of the substrate SUB. The former is more advantageous in terms of the smaller number of measurements, but batch management of the substrate SUB is required. Since the latter performs the measurements for individual pieces, an in-line measuring apparatus or the like is necessary, but strict management is possible because the measurement is performed for each individual piece. The measurement of the angle error described above may be performed by a manufacturer of semiconductor device. Alternatively, the substrate SUB may be prepared in such a manner that a third party such as a substrate maker measures the angle error, and the substrate SUB whose error data has been specified is delivered to the manufacturer.

Further, in the exposure process, an angle correction with respect to the orientation flat is performed by the exposure apparatus using the above-described error data obtained in advance. As described in the first method, θ2<<θ1 is satisfied as a premise in the exposure apparatus to be used. In this manner, the angle error between the extending direction (x direction) of the trench DT and the <11-20> direction is set within ±θ. However, it is assumed that the angle error between the direction of orientation flat of the substrate SUB prepared in advance and the <11-20> direction is in a range that can be corrected in the exposure apparatus.

Combined use of first and second methods: The combined use of the first and second methods described above is effective depending on the required θ. Namely, in this case, the substrate SUB having the first angle error smaller than the standard specification is prepared, error data of the first angle error is measured, and angle correction is performed in the exposure apparatus using the error data. According to this method, since θ can be made small, it is possible to deal with the backfilling of the trench DT having an extremely large aspect ratio (for example, an aspect ratio of 10 or more), and it is possible to obtain an effect of making the impurity concentration distribution uniform in the backfill crystal region inside the trench DT irrespective of the aspect ratio.

For forming the trench DT, for example, the ICP etching apparatus is used. In addition, it is desirable that the temperature of the lower electrode on which the substrate SUB is mounted during the etching is controlled to 50° C. or more, and it is thus possible to form the trenches DT having a desired shape with satisfactory reproducibility and uniformity.

Figure 8:
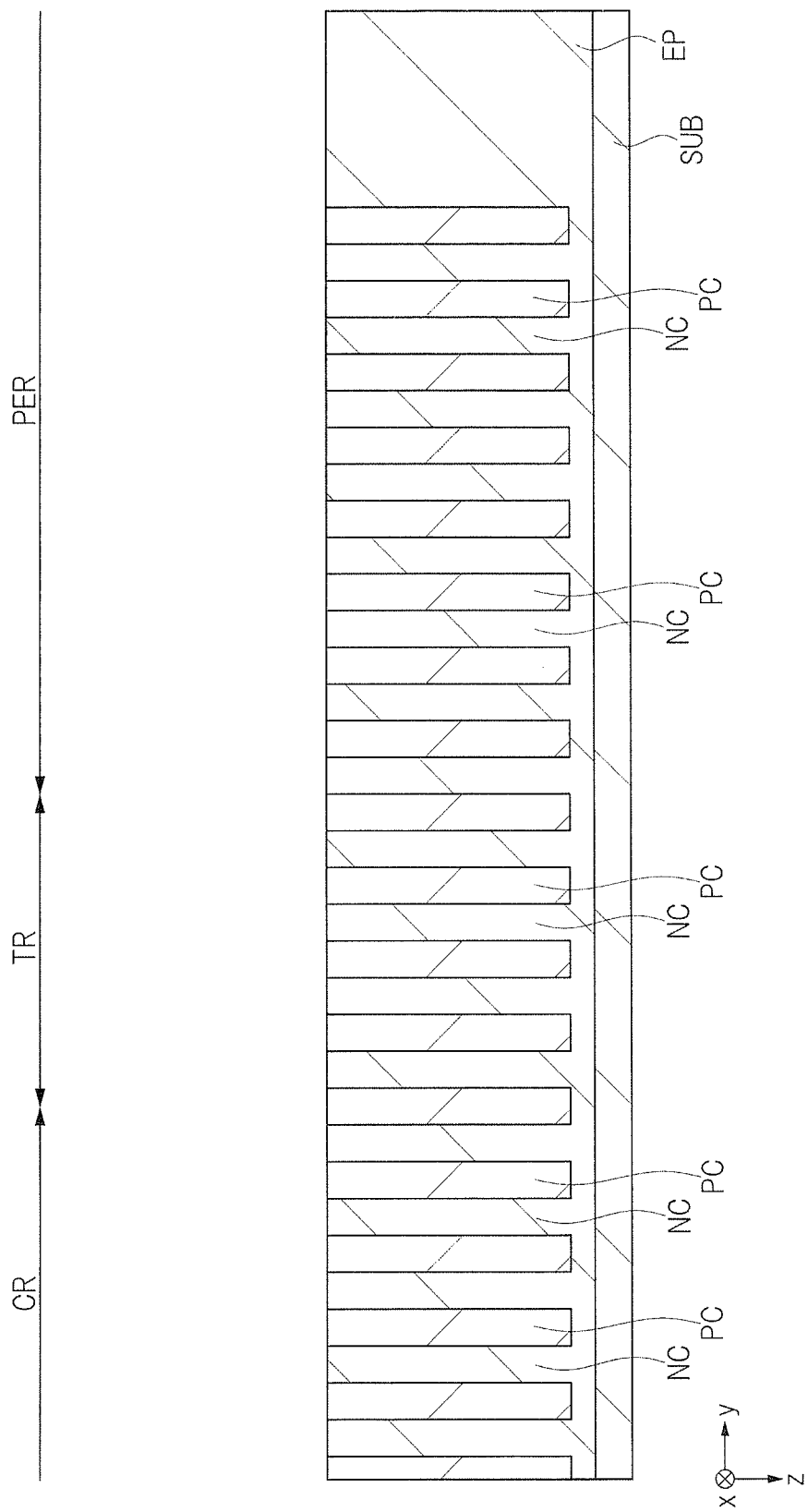
FIG. 8 is a cross-sectional view showing the manufacturing process of the semiconductor device continued from FIG. 7.

Next, as shown in FIG. 8, a p-type semiconductor layer which is a crystal layer having the same crystal structure as the epitaxial layer EP is formed inside the plurality of trenches DT formed in the epitaxial layer EP in the cell region CR, the transition region TR, and the peripheral region PER by, for example, the filling epitaxial growth method. Subsequently, the p-type semiconductor layer grown on the upper surface of the epitaxial layer EP (n-type column region NC) that separates the adjacent trenches DT is ground and further polished by, for example, the CMP (Chemical Mechanical Polishing) method, thereby forming the p-type column regions PC made of the p-type semiconductor layer only in the plurality of trenches DT. The part between the trenches DT spaced apart from each other in the y direction serves as the n-type column region NC composed of the epitaxial layer EP.

Since the angle error between the extending direction of the plurality of trenches DT and the <11-20> direction is within ±θ, even in the case of the trench DT having the aspect ratio of about 10, the upper portion and the both end portions of the trench DT are not closed, and the insides of the plurality of trenches DT can be backfilled with the p-type semiconductor layer without forming voids.

Further, in the filling epitaxial growth method, it is possible to backfill the insides of the plurality of trenches DT with the p-type semiconductor layer with satisfactory reproducibility by controlling the gas species, the gas flow rate, the temperature, the pressure, and the like. As the gas species, for example, silicon (Si) source gas, carbon (C) source gas, hydrogen ($H_2$) gas, hydrochloric acid (HCl) gas, and doping gas are used. As the silicon (Si) source gas, for example, monosilane ($SiH_4$) gas or the like is used. As the carbon (C) source gas, for example, ethylene ($C_2H_4$), methyl acetylene ($C_3H_4$), propane ($C_3H_8$) or the like is used. In addition, when aluminum (Al) is selected as the p-type dopant, trimethyl aluminum (TMA), triethyl aluminum (TEA) or the like is used as the doping gas.

As the conditions of the filling epitaxial growth method, the HCl/SiH$_4$ flow ratio is, for example, 30 or more and 65 or less, and the H$_2$/SiH$_4$ flow ratio is, for example, 500 or more and 7,000 or less.

FIG. 21 is a diagram showing an example of the backfilling in the cases where the HCl/SiH$_4$ flow ratio is 33.3, 50, and 66.7 in the filling epitaxial growth method. The H$_2$/SiH$_4$ flow ratio is 5,000.

As shown in FIG. 21, when the HCl/SiH$_4$ flow ratio is 33.3, the inside the trench DT is satisfactorily backfilled with the p-type semiconductor layer. However, when the HCl/SiH$_4$ flow ratio becomes smaller than 30, the upper portion of the trench DT tends to be closed and voids are generated. On the other hand, when the HCl/SiH$_4$ flow ratio becomes larger than 65, the etching becomes excessively strong, and the shape of the initial trench DT collapses. Also, when the H$_2$/SiH$_4$ flow ratio becomes smaller than 500, the surface bunching becomes remarkable. On the other hand, when the H$_2$/SiH$_4$ flow ratio becomes larger than 7,000, excessive etching occurs or voids are generated.

Further, the pressure in the growth furnace during the epitaxial growth is set to, for example, 30 kPa or more and 100 kPa or less.

Figure 22:
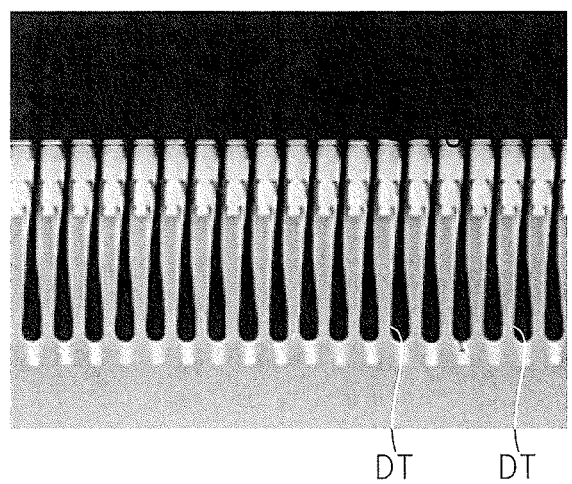
FIG. 22 is a diagram showing an example of backfilling in the case where a pressure in a growth furnace during epitaxial growth is 10 kPa in the filling epitaxial growth method.

FIG. 22 is a diagram showing an example of backfilling in the case where the pressure in the growth furnace during the epitaxial growth is 10 kPa in the filling epitaxial growth method.

As shown in FIG. 22, at the pressure lower than 30 kPa which is the lower limit pressure, the etching becomes excessively strong particularly to the side surface of the trench DT, and the shape of the initial trench DT collapses. On the other hand, although it is desirable that the upper limit pressure is high, the atmospheric pressure is the upper limit pressure in order to perform safe epitaxial growth in a quartz furnace.

Note that the conditions of the filling epitaxial growth method can be changed during the epitaxial growth, and the doping gas flow rate, the SiH$_4$ flow rate, and carbon/silicon (C/Si) ratio may be changed as appropriate during the epitaxial growth. This enables to make the concentration distribution of the p-type semiconductor layer in the backfill region uniform.

Also, the p-type impurity concentration, width, and pitch of the p-type column region PC in each of the cell region CR, the transition region TR, and the peripheral region PER are set so as to achieve the charge balance. The semiconductor device according to the first embodiment exemplifies a case where the ratio of the width of the p-type column region PC in the y direction to the width of the n-type column region NC in the y direction is 1:1. In this case, the p-type impurity concentration of the p-type column region PC is set such that the total charge amount of the p-type column region PC and the total charge amount of the n-type column region NC are the same. Therefore, the p-type impurity concentration of the p-type column region PC is the same as the n-type impurity concentration of the epitaxial layer EP constituting the n-type column region NC, and is, for example, about $3.0 \times 10^{16}/cm^3$.

In the manner described above, according to the first embodiment, the super-junction structure in which the p-type column region PC and the n-type column region NC are alternately formed is formed in the epitaxial layer EP by the "trench filling method".

Next, a process of forming the element portion on the upper surface of the epitaxial layer EP in which the super-junction structure has been formed will be described.

Figure 9:
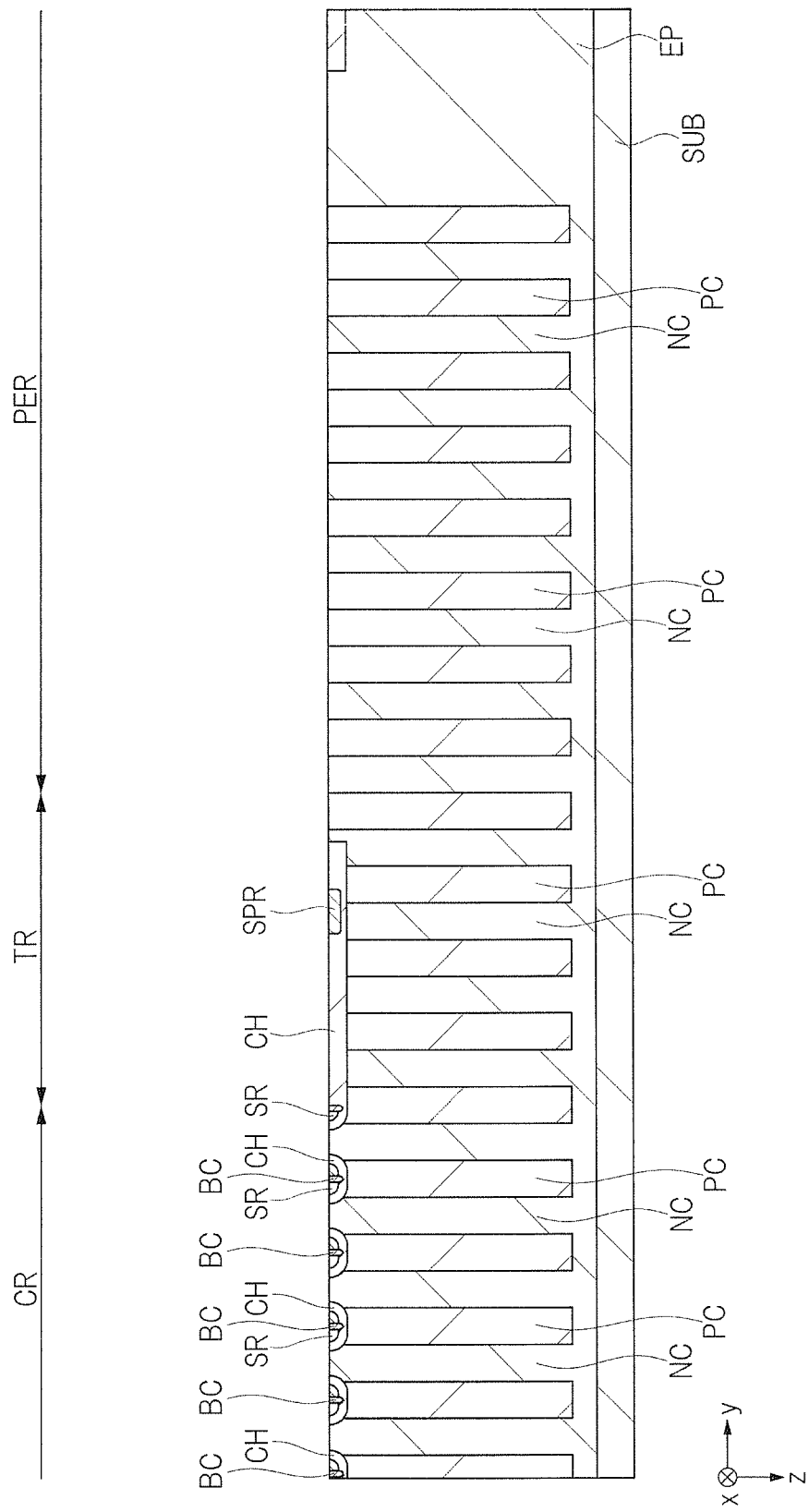
FIG. 9 is a cross-sectional view showing the manufacturing process of the semiconductor device continued from FIG. 8.

As shown in FIG. 9, after the upper surface of the epitaxial layer EP is planarized, the channel region CH is formed in the cell region CR and the transition region TR by, for example, the selective ion implantation method using a pattern made of an insulating material as a hard mask. The channel region CH is a p-type semiconductor region formed by, for example, introducing a p-type impurity such as aluminum (Al) or boron (B) into the epitaxial layer EP.

Next, the plurality of source regions SR are formed in the cell region CR by, for example, the selective ion implantation method using a pattern made of an insulating material as a hard mask, and the source lead-out region SPR is formed in the transition region TR. The source region SR and the source lead-out region SPR are n-type semiconductor regions formed by introducing an n-type impurity such as nitrogen (N), phosphorus (P) or arsenic (As) into the epitaxial layer EP. The plurality of source regions SR formed in the cell region CR are electrically connected to the source lead-out region SPR formed in the transition region TR.

Next, the body contact region BC whose bottom reaches the channel region CH is formed in the center part of each of the plurality of source regions SR in the cell region CR by, for example, the selective ion implantation method using a pattern made of an insulating material as a hard mask. The body contact region BC is a p-type semiconductor region formed by, for example, introducing a p-type impurity such as aluminum (Al) or boron (B) into the epitaxial layer EP, and is formed such that the impurity concentration of the body contact region BC is higher than the impurity concentration of the channel region CH.

Note that, in a series of the ion implantation process described above, the ion implantation may be performed while setting the temperature of the substrate SUB to 300° C. or higher in order to suppress the defects caused by the ion implantation. In addition, though not described here, a termination structure may be formed by performing the ion implantation for ensuring a high withstand voltage.

Next, after a series of ion implantation process, a cap layer for preventing surface roughness, for example, a carbon film having a thickness of 1 µm or more is deposited on the upper surface of the epitaxial layer EP by the sputtering method or the like, and heat treatment is performed at a temperature of about 1600° C. to 1800° C. for activating the impurity. Thereafter, the cap layer is removed.

Figure 10:
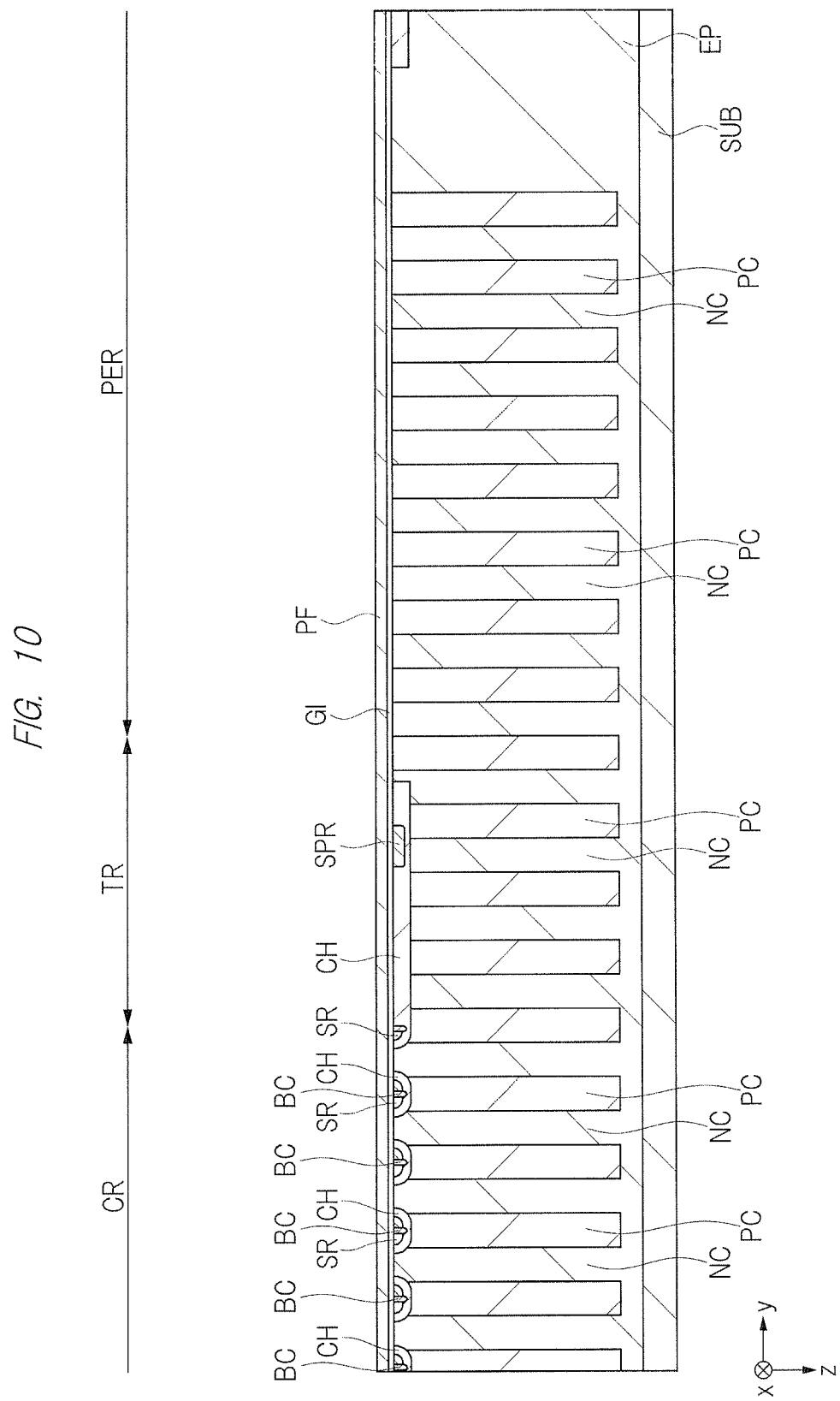
FIG. 10 is a cross-sectional view showing the manufacturing process of the semiconductor device continued from FIG. 9.

Next, as shown in FIG. 10, the gate insulating film GI is formed on the upper surface of the epitaxial layer EP, and a conductor film PF is formed on the gate insulating film GI. The gate insulating film GI is made of, for example, silicon oxide, and is formed by, for example, the thermal oxidation method. However, the gate insulating film GI is not limited to a silicon oxide film, and may be a high dielectric constant film having a higher dielectric constant than a silicon oxide film typified by a hafnium oxide film. On the other hand, the conductor film PF formed on the gate insulating film GI is made of, for example, polycrystalline silicon, and is formed by, for example, the CVD (Chemical Vapor Deposition) method.

Figure 11:
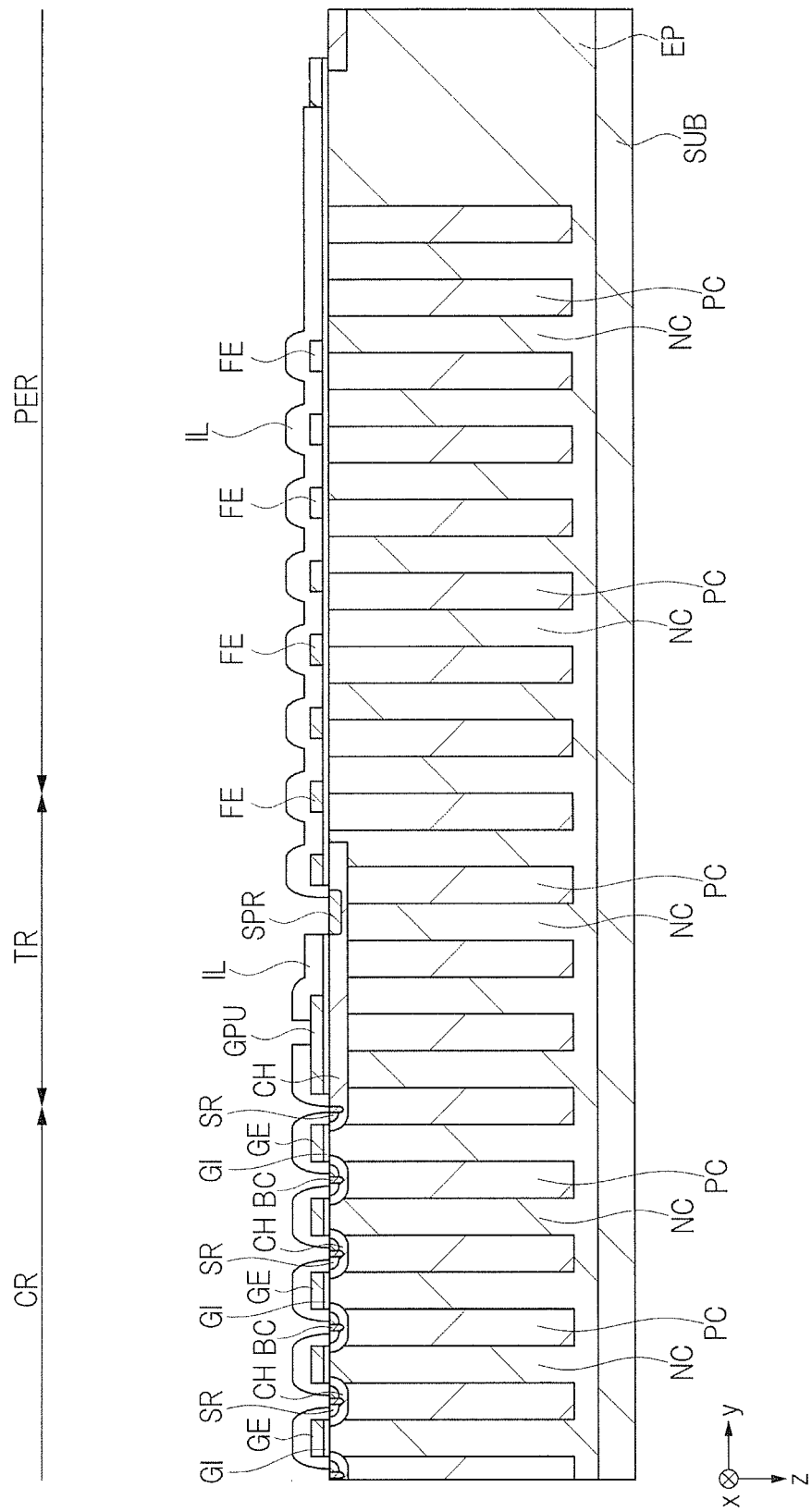
FIG. 11 is a cross-sectional view showing the manufacturing process of the semiconductor device continued from FIG. 10.

Next, as shown in FIG. 11, the conductive film PF is patterned by, for example, the selective etching method using a resist pattern as a mask. As a result, the plurality of gate electrodes GE are formed in the cell region CR, the gate lead-out portion GPU is formed in the transition region TR, and the plurality of dummy electrodes FE are formed in the peripheral region PER. The gate lead-out portion GPU is formed so as to be electrically connected to the plurality of gate electrodes GE.

Next, the interlayer insulating film IL that covers the plurality of gate electrodes GE, the gate lead-out portion GPU, and the plurality of dummy electrodes FE is formed on the upper surface of the epitaxial layer EP. The interlayer insulating film IL is made of, for example, silicon oxide, and is formed by, for example, the CVD method.

Next, for example, by the selective etching method using a resist pattern as a mask, openings whose bottoms reach the source region SR and the body contact region BC between the adjacent gate electrodes GE in the cell region CR are formed in the interlayer insulating film IL, and an opening that exposes a part of the gate lead-out portion GPU in the transition region TR is formed. In addition, in the transition region TR, the source lead-out region SPR is exposed by forming an opening in the interlayer insulating film IL.

Figure 12:
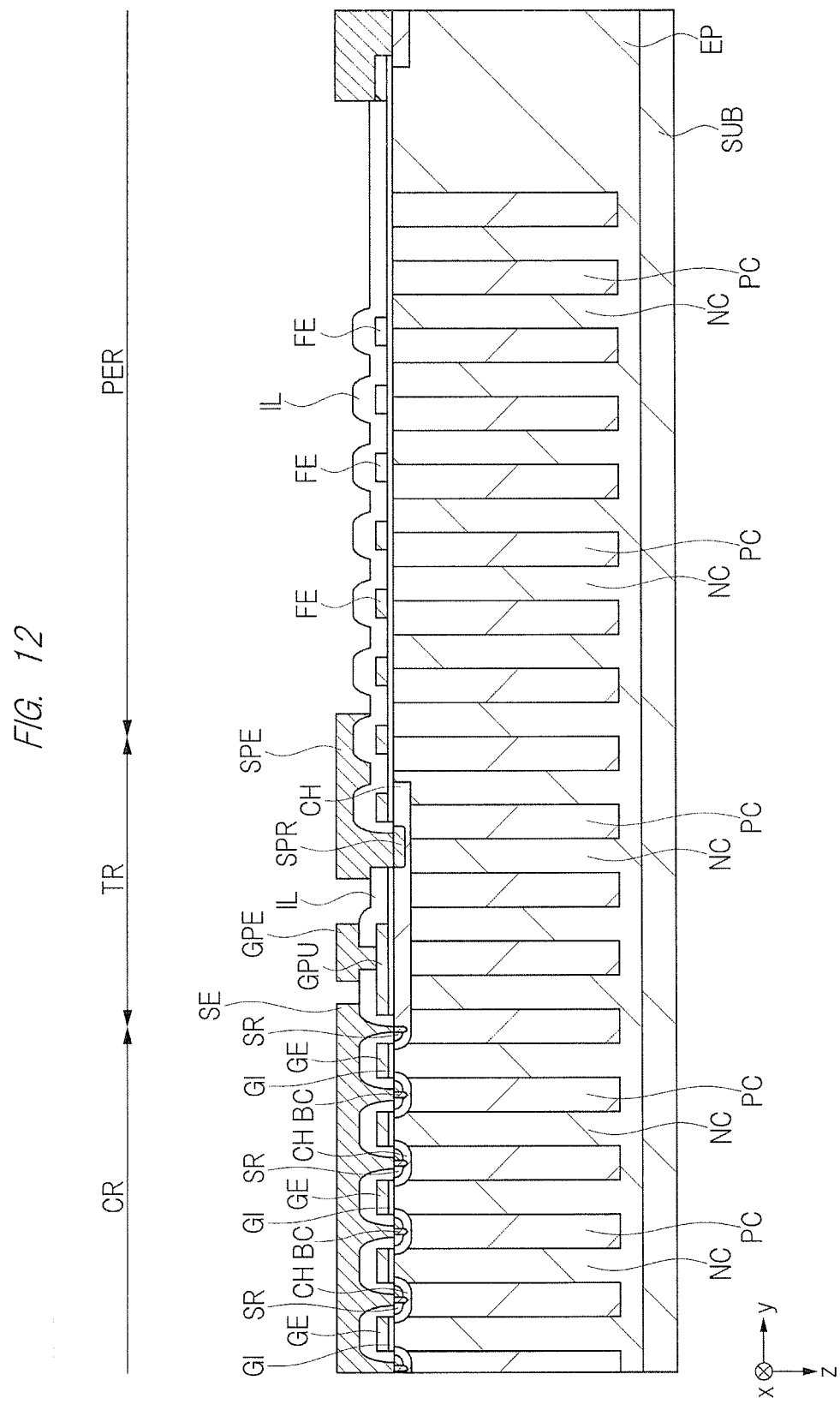
FIG. 12 is a cross-sectional view showing the manufacturing process of the semiconductor device continued from FIG. 11.

Next, as shown in FIG. 12, a metal film is formed on the interlayer insulating film IL including the openings that expose the source region SR and the body contact region BC, the opening that exposes the gate lead-out portion GPU, and the opening that exposes the source lead-out region SPR. The metal film is formed of a stacked film of, for example, a titanium tungsten (TiW) film and an aluminum (Al) film, and is formed by, for example, the sputtering method.

Then, the metal film is patterned by, for example, the selective etching method using a resist pattern as a mask. As a result, the source electrode SE that is electrically connected to the source region SR and the body contact region BC is formed in the cell region CR, and the gate lead-out electrode GPE that is electrically connected to the gate lead-out portion GPU and the source lead-out electrode SPE that is electrically connected to the source lead-out region SPR are formed in the transition region TR.

Figure 13:
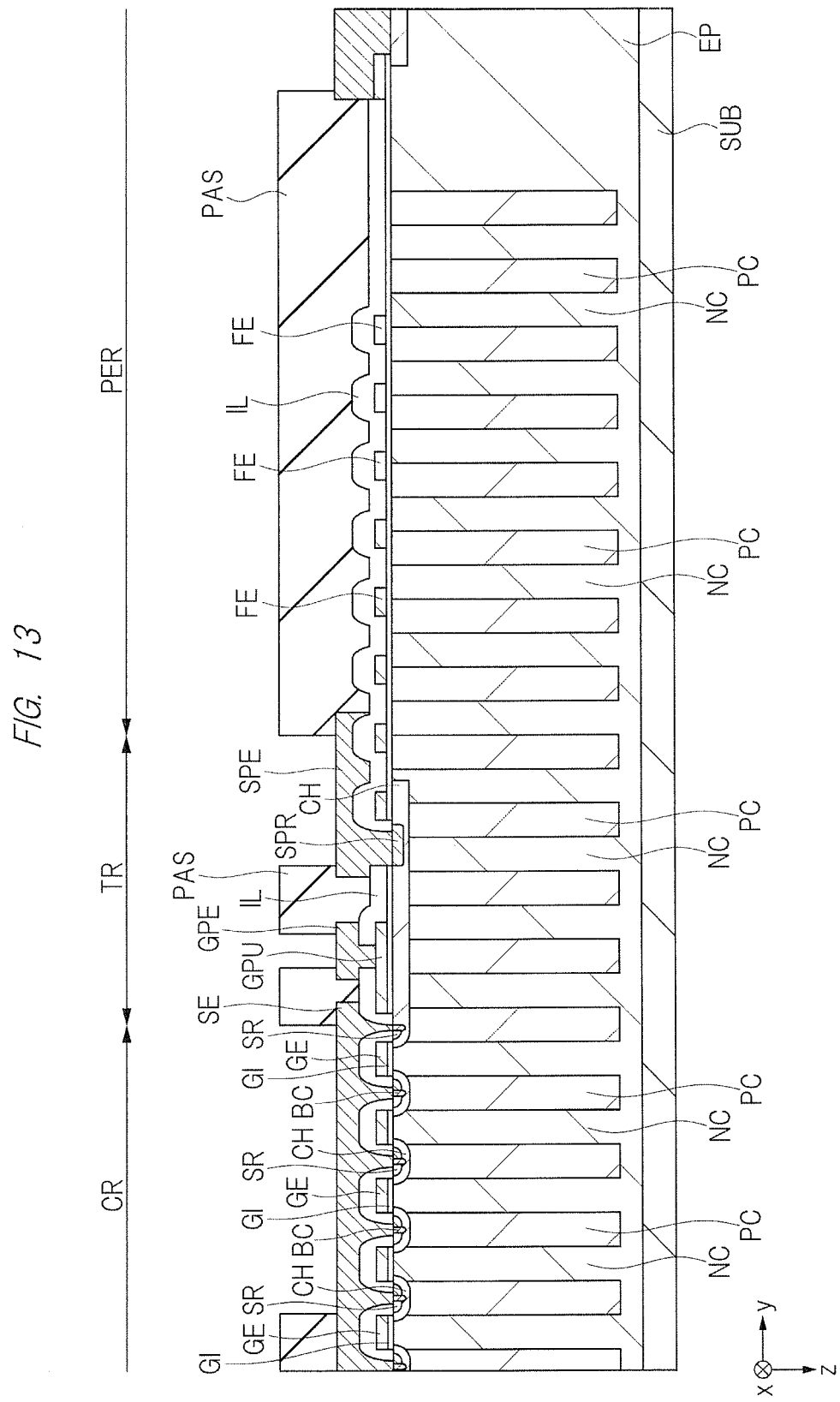
FIG. 13 is a cross-sectional view showing the manufacturing process of the semiconductor device continued from FIG. 12.

Next, as shown in FIG. 13, the surface protective film PAS is formed so as to cover the source electrode SE, the gate lead-out electrode GPE, and the source lead-out electrode SPE. Then, the surface protective film PAS is patterned by, for example, the selective etching method using a resist pattern as a mask, thereby exposing a partial region of the source electrode SE, a partial region of the gate lead-out electrode GPE, and a partial region of the source lead-out electrode SPE. In this manner, the regions exposed from the surface protective film PAS can function as external connection regions.

Figure 14:
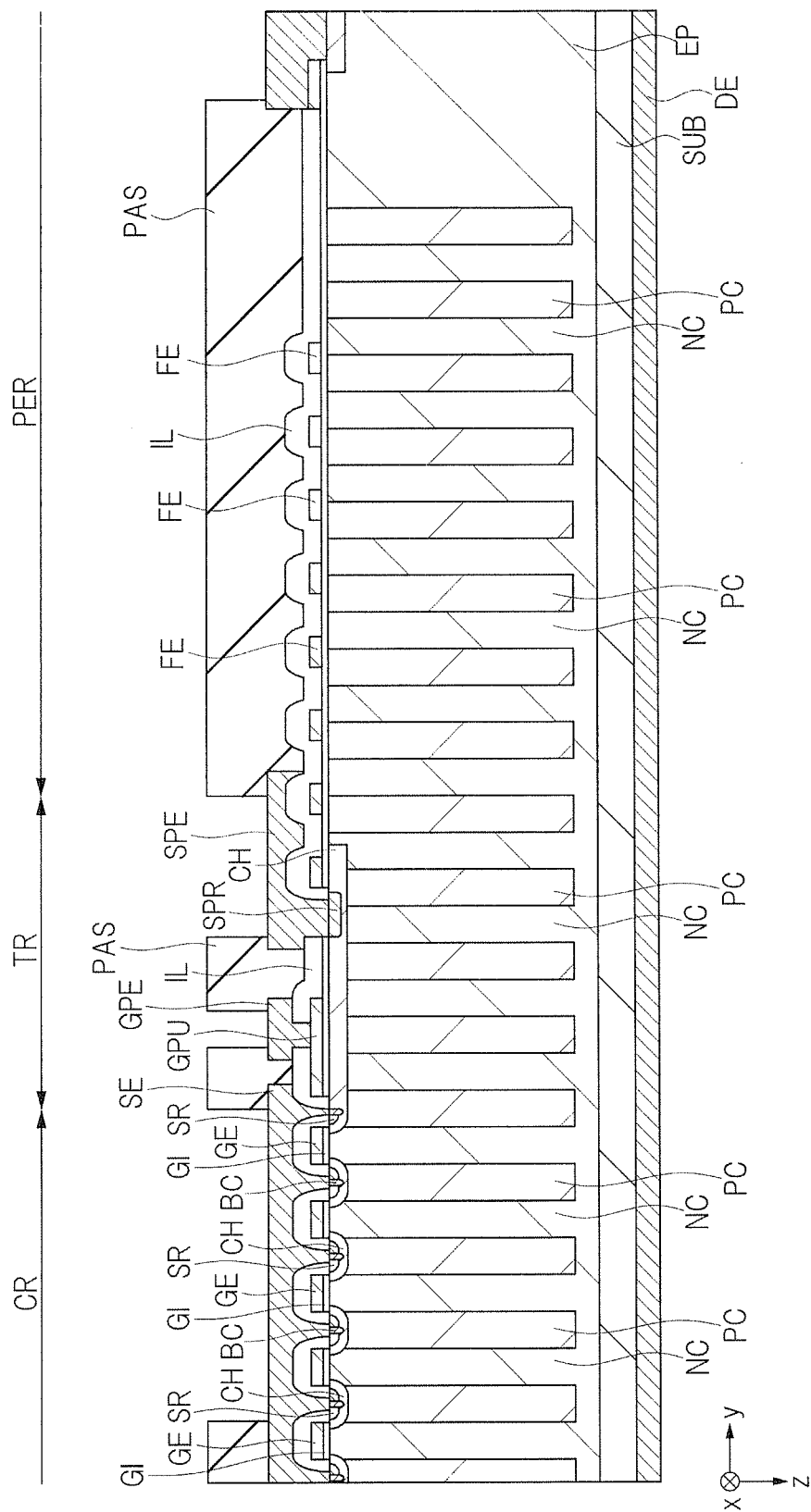
FIG. 14 is a cross-sectional view showing the manufacturing process of the semiconductor device continued from FIG. 13.

Next, as shown in FIG. 14, the substrate SUB is thinned by grinding the substrate SUB from the back surface on an opposite side to the main surface of the substrate SUB. Then, a metal film to be the drain electrode DE is formed on the back surface of the substrate SUB by the sputtering method or the deposition method. Thereafter, for example, the laser annealing corresponding to the heat treatment at about 1,000° C. is performed so as to obtain the low resistance contact.

In the manner described above, the semiconductor device including the power MOSFET having the super-junction structure according to the first embodiment can be manufactured.

In the first embodiment, the SiC single crystal substrate having the main surface (off-angle) whose (0001) surface is tilted by 4° in the <11-20> direction is exemplified, but the SiC substrate is not limited to this. For example, an SiC single crystal substrate having the main surface whose (0001) surface is tilted by 1° or more and 5° or less in the <11-20> direction may be used. Alternatively, an SiC single crystal substrate having an off-angle in a main crystal surface of a (000-1) surface instead of the (0001) surface may be used.

Further, a hexagonal SiC single crystal substrate having a main surface whose main crystal surface is tilted in the <11-20> direction is exemplified, but the SiC substrate is not limited to this. For example, a hexagonal SiC single crystal substrate having a main surface whose main crystal surface is tilted in the <1-100> direction orthogonal to the <11-20> direction may be used. If necessary, the crystal direction in which the off-angle is provided may be any direction other than those described above. Therefore, a predetermined crystal direction in which the off-angle is provided such as the <11-20> direction is generally referred to as a reference crystal direction.

Further, a 4H polytype SiC substrate (4H—SiC) which is currently mainstream is exemplified as a hexagonal SiC single crystal substrate, but the present invention can be applied even when a 6H polytype SiC substrate (6H—SiC) having an off-angle is used.

Also, there is a possibility that the present invention can be similarly applied to other wide gap compound semiconductors such as nitrogen gallium (GaN) as a hexagonal substrate. Further, there is a possibility that the present invention can be applied for the similar issue even if a crystal structure differs as in 3C—SiC, gallium oxide ($Ga_2O_3$) or the like.

In addition, in the <<Manufacturing Method of Semiconductor Device>> described above, the orientation flat OF is used as a reference mark with respect to the <11-20> direction. Incidentally, in a 4-inch SiC substrate which is currently commercially available, a reference mark referred to as a primary flat or a secondary flat is provided. Accordingly, the orientation flat is a generic term including the primary flat and the secondary flat. Also, in a large-size Si substrate, a notch is used as the similar reference mark in some cases. Therefore, the orientation flat OF described in the first embodiment more generally means a reference mark for indicating a specific crystal orientation provided in the substrate.

As described above, the angle error between the extending direction of the trench DT and the <11-20> direction is set within ±θ. Herein, θ is determined as described above in (Knowledge E). Accordingly, when the power MOSFET having the super-junction structure in which the p-type column region PC and the n-type column region NC are alternately arranged is formed by the trench filling method, the insides of the plurality of trenches DT can be favorably backfilled without forming voids. As a result, the manufacturing yield and the reliability of the semiconductor device can be improved.

In addition to the inventions described in the claims, the inventions as described below in [Appendix A] and [Appendix B] can also be comprehended from the first embodiment above. In addition, inventions corresponding to combinations of these inventions and the inventions described in the claims are also comprehended.

APPENDIX A

A semiconductor device comprising: a substrate having a main surface on which an off-angle tilted in a predetermined reference crystal direction (for example, <11-20> direction or <1-100> direction) with respect to a predetermined main crystal surface (for example, (0001) surface or (000-1) surface) is provided; a plurality of trenches that are provided in the substrate so as to extend in a first direction along the main surface of the substrate and to be spaced apart from each other in a second direction orthogonal to the first direction along the main surface of the substrate; a first column region that is provided inside each of the trenches and is made of a crystal layer having the same crystal structure as the substrate; and a second column region made of a part of the substrate between the trenches adjacent to each other in the second direction, wherein an angle error between the reference crystal direction and the first direction is within ±θ, and when a depth of the trench is h, a width of the trench is w, and k is a coefficient larger than 0 and smaller than 2, the θ is determined by θ={arctan {k×(w/h)}}/13.

APPENDIX B

The semiconductor device according to [Appendix A], wherein the trench has a tapered shape that becomes narrower as it gets deeper, and a taper angle formed by a bottom surface and a side surface of the trench is 88° to 90°.

Second Embodiment

Figure 15:
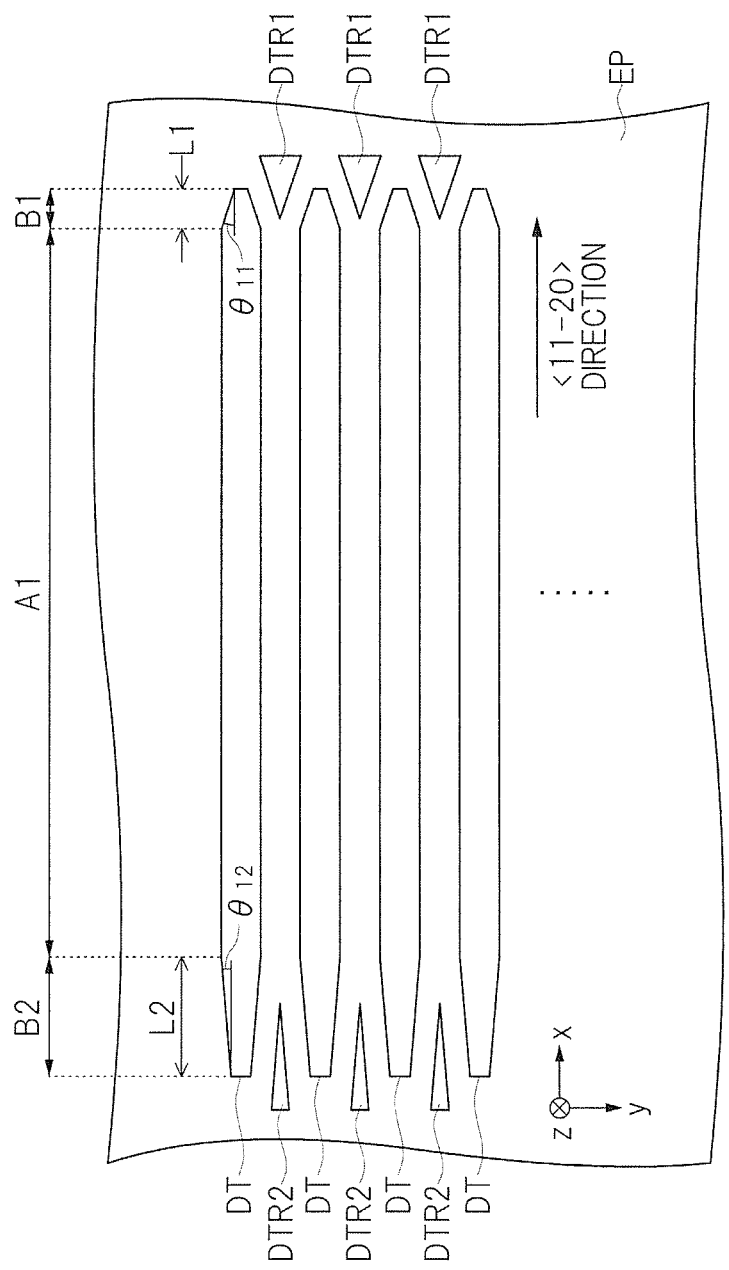
FIG. 15 is a plan view showing a plurality of trenches formed in a substrate according to a second embodiment.
Figure 16:
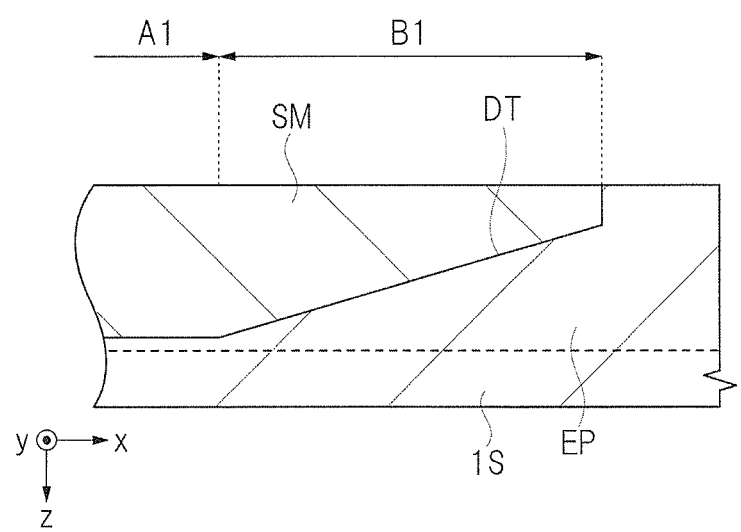
FIG. 16 is an enlarged cross-sectional view showing an end of the trench formed in the substrate according to the second embodiment.

A semiconductor device according to the second embodiment will be described with reference to FIGS. 15 and 16. FIG. 15 is a plan view showing a plurality of trenches formed in a substrate according to the second embodiment. FIG. 16 is an enlarged cross-sectional view showing an end portion of the trench formed in the substrate according to the second embodiment.

(1) First Feature and Effect Thereof

As shown in FIG. 15, the plurality of trenches DT constituting the super-junction structure are formed in the epitaxial layer EP. The plurality of trenches DT extend in the x direction and are spaced apart from each other in the y direction, and the plurality of trenches DT are backfilled with a semiconductor layer by the filling epitaxial growth method.

Further, in the center portion A1 of the trench DT in the x direction, the trench DT has a constant width in the y direction in plan view, but in a first tip portion B1 and a second tip portion B2 at both end portions of the trench DT in the x direction, the side surfaces of the trench DT are inclined with respect to the x direction in plan view and the width in the y direction gradually decreases as approaching the outer periphery of the semiconductor device. The shape in which the side surfaces of the trench DT are inclined with respect to the x direction in plan view is referred to as a "tapered shape".

As with the first embodiment described above, the angle error between the extending direction of the trench DT (x direction) and the <11-20> direction is within ±θ. Herein, θ is determined as described above in (Knowledge E).

Also, as shown in FIG. 16, at the first tip portion B1 and the second tip portion B2 of the trench DT, the bottom surface of the trench DT is inclined with respect to the upper surface of the epitaxial layer EP (horizontal surface formed by the x direction and the y direction), and the width in the z direction gradually decreases as approaching the outer periphery of the semiconductor device.

When the trench DT is backfilled with the semiconductor layer SM by using the filling epitaxial growth method, silicon (Si) or carbon (C) contained in the source gas is more consumed at the first tip portion B1 and the second tip portion B2 of the trench DT, and the trench DT tends not to be successfully filled with the semiconductor layer SM at the tip portions B1 and B2 compared with the center portion A1 of the trench DT. However, in the second embodiment, since the side surfaces and the bottom surface of the trench DT are inclined at the first tip portion B1 and the second tip portion B2 of the trench DT, the volume of the trench DT gradually decreases as approaching the outer periphery of the semiconductor device, so that the inside of the trench DT can be backfilled with the semiconductor layer SM even if the semiconductor layer SM for backfilling the trench DT by the filling epitaxial growth method is reduced.

(2) Second Feature and Effect Thereof

As shown in FIG. 15, a length L1 of the first tip portion B1 of the trench DT in the x direction and a length L2 of the second tip portion B2 of the trench DT in the x direction are different from each other, and the length L1 of the first tip portion B1 located in the <11-20> direction is shorter than the length L2 of the second tip portion B2 located in the direction opposite to the <11-20> direction. In other words, an angle $\theta_{11}$ formed between the side surface of the first tip portion B1 located in the <11-20> direction and the x direction is larger than an angle θ12 formed between the side surface of the second tip portion B2 located in the direction opposite to the <11-20> direction and the x direction.

When the trench DT is backfilled with the semiconductor layer by using the filling epitaxial growth method, the second tip portion B2 located in the direction opposite to the <11-20> direction tends not to be successfully filled with the semiconductor layer compared with the first tip portion B1 located in the <11-20> direction. Accordingly, there is a concern that the first tip portion B1 located in the <11-20> direction and the second tip portion B2 located in the direction opposite to the <11-20> direction cannot be filled with the semiconductor layer at approximately the same time.

However, in the second embodiment, the first tip portion B1 located in the <11-20> direction and the second tip portion B2 located in the direction opposite to the <11-20> direction are formed to have different shapes. In addition, the second tip portion B2 located in the direction opposite to the <11-20> direction is formed to have a shape that is more easily filled with the semiconductor layer than the first tip portion B1 located in the <11-20> direction, so that the first tip portion B1 located in the <11-20> direction and the second tip portion B2 located in the direction opposite to the <11-20> direction can be filled with the semiconductor layer at approximately the same time.

(3) Third Feature and Effect Thereof

As shown in FIG. 15, a first dummy pattern DTR1 of a trench is formed between the first tip portions B1 of the trenches DT adjacent to each other in the y direction, and a second dummy pattern DTR2 of a trench is formed between the second tip portions B2 of the trenches DT adjacent to each other in they direction. Further, each of the first dummy patterns DTR1 and the second dummy patterns DTR2 is backfilled with the semiconductor layer by the filling epitaxial growth method.

The first dummy pattern DTR1 is arranged so as to be spaced apart from the first tip portions B1 of the trenches DT adjacent to each other in the y direction, and the second dummy pattern DTR2 is arranged so as to be spaced apart from the second tip portions B2 of the trenches DT adjacent to each other in the y direction.

The shapes of the first dummy pattern DTR1 and the second dummy pattern DTR2 are triangular in plan view. A side surface of the first dummy pattern DTR1 opposed to the side surface of the first tip portion B1 of the trench DT is formed to be parallel to the side surface of the first tip portion B1, and a side surface of the second dummy pattern DTR2 opposed to the side surface of the second tip portion B2 of the trench DT is similarly formed to be parallel to the side surface of the second tip portion B2.

The inventors examined, as a comparative example, the technology of forming a plurality of trenches in a substrate made of Si (silicon) single crystal (hereinafter, referred to as an Si single crystal substrate) and backfilling the insides of the plurality of trenches with a semiconductor layer by the filling epitaxial growth method. In that case, the influence due to the presence or absence of the dummy pattern did not appear remarkably in the aspect of the semiconductor layer filled in the trenches DT. However, in the case of the SiC single crystal substrate, the influence due to the presence or absence of the dummy pattern appeared remarkably in the aspect of the semiconductor layer filled in the trenches DT, and the more favorable backfilling of the semiconductor layer was achieved when the first dummy pattern DTR1 and the second dummy pattern DTR2 were provided.

(4) Modification

Figure 17:
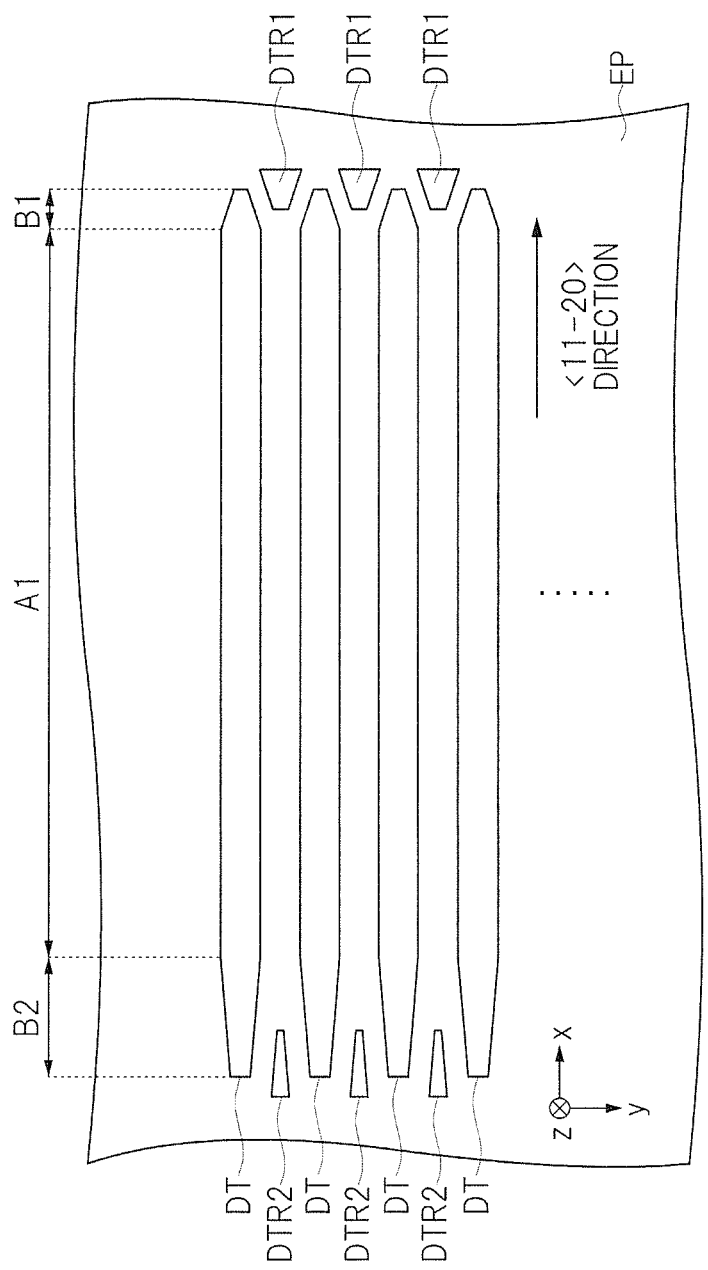
FIG. 17 is a plan view showing a plurality of trenches formed in a substrate according to a modification of the second embodiment.

A semiconductor device according to a modification of the second embodiment will be described with reference to FIG. 17. FIG. 17 is a plan view showing a plurality of trenches formed in a substrate according to the modification of the second embodiment.

As shown in FIG. 17, the shapes of the first dummy pattern DTR1 and the second dummy pattern DTR2 may be trapezoidal in plan view. Also in this case, the side surface of the first dummy pattern DTR1 opposed to the side surface of the first tip portion B1 of the trench DT is formed to be parallel to the side surface of the first tip portion B1, and the side surface of the second dummy pattern DTR2 opposed to the side surface of the second tip portion B2 of the trench DT is similarly formed to be parallel to the side surface of the second tip portion B2.

FIGS. 29(a), 29(b), and 29(c) are plan views showing modifications of the tip shape of the trench in the second embodiment and the modification of the second embodiment. Namely, FIGS. 29(a), 29(b), and 29(c) show the modifications of the tip shape of the trench DT in FIG. 15 and FIG. 17. It is assumed that the trench DT shown in FIG. 15 has a shape in which the tip ends are cut at the first and second tip portions (a shape having a finite width at the tip end).

Meanwhile, the trench DT in FIG. 29(a) has a pointed tip shape (ideally a shape having a zero width at the tip end), and is otherwise the same as that of FIG. 15. Note that, in the case where the trench is formed by a usual method using a photomask having a pattern with the pointed tip shape as shown in FIG. 29(a), the resulting trench DT has a blunt shape with a finite width at the tip end as shown in FIG. 15 due to "dullness" of the pattern that occurs in the photomask process and "dullness" in the etching process.

For this reason, the shape of the tip pointed as sharp as possible in FIG. 29(a) is realized using a technique such as the optical proximity correction OPC (Optical Proximity Correction). With respect to the first tip portion B1 of the trench DT and the second tip portion B2 of the trench DT shown in FIG. 29(a), the angles formed between the side surfaces thereof and the x direction (here, angles from the center line) are assumed to be θ11 and θ12, respectively. By adopting the pointed tip shape shown in FIG. 29(a), the tilt growth at the mesa top is promoted in accordance with the angle θ11 and the angle θ12, and it is possible to suppress the dent (recess) at the end portion of the trench on the wafer surface after planarization.

FIG. 29(b) shows an example in which a tip portion has a recess with a pointed tip. This is a case in which the recess with a pointed tip is formed in a direction opposite to that in FIG. 29(a). Herein, with respect to the state shown in FIG. 29(a), the tip shape of the trench is defined as having "positive curvature" when viewed from the center line of the trench, and with respect to the state shown in FIG. 29(b), the tip shape of the trench is defined as having "negative curvature" when viewed from the center line of the trench.

With respect to the first tip portion B1 of the trench DT and the second tip portion B2 of the trench DT shown in FIG. 29(b), the angles formed between the side surfaces thereof and the center line are assumed to be $\theta_{11}$ and $\theta_{12}$, respectively. By adopting the shape in which the tip portion has a recess with a pointed tip shown in FIG. 29(b), the diffusion of the source gas from the tip portion of the trench to the center of the trench is promoted, and it is possible to suppress the dent (recess) at the end portion of the trench on the wafer surface after planarization.

FIG. 29(c) shows an example in which each tip portion has an asymmetrical shape with respect to the center line of the trench. This shape can also be regarded as having a right triangle at the tip portion. With respect to the first tip portion B1 of the trench DT and the second tip portion B2 of the trench DT shown in FIG. 29(c), the angles of the tip portions (angles of the right triangles not in contact with the center portion A1) are assumed to be $\theta_{21}$ and $\theta_{22}$, respectively. Although the shape of the trench in FIG. 29(c) is substantially rhombus, it may also be trapezoidal. By adopting the shape shown in FIG. 29(c), the same effect as in the case of FIG. 29(a) described above can be obtained.

The proper range for $\theta_{11}$, $\theta_{12}$, $\theta_{21}$, and $\theta_{22}$ in FIGS. 29(a) to 29(c) is larger than θ determined by Expression (7) and smaller than 90 degrees. It is preferably 45° or less, and is more preferably 30° or less. Further, as described in the section of "(2) Second Feature and Effect Thereof" in the (Second Embodiment) above, it is more preferable that the relationships of $\theta_{11} > \theta_{12}$ and $\theta_{21} > \theta_{22}$ are satisfied.

(5) Appendix

The second embodiment includes at least the following embodiments and inventions without conditions of the angle error θ are also comprehended. Note that the invention of the combination of these inventions and the invention comprehended by the above-described first embodiment is not excluded.

APPENDIX 1

A semiconductor device comprising:

a single crystal substrate having a main surface provided with an off-angle tilted in a predetermined reference crystal direction (for example, <11-20> direction or <1-100> direction) with respect to a predetermined main crystal surface (for example, (0001) surface or (000-1) surface);

a plurality of trenches provided in the substrate so as to extend in a first direction along the main surface of the substrate and to be spaced apart from each other in a second direction orthogonal to the first direction along the main surface of the substrate;

a first column region provided in the trench and made of a crystal layer having the same crystal structure as the substrate; and a second column region made of a part of the substrate between the trenches adjacent to each other in the second direction, wherein a first tip portion and a second tip portion located at both end portions of the trench in the first direction have a first width and a second width in the second direction, respectively, a center portion of the trench between the first tip portion and the second tip portion has a third width in the second direction, and the first width and the second width are narrower than the third width.

APPENDIX 2

The semiconductor device according to Appendix 1,
wherein the first width and the second width gradually decrease as going toward an outer circumferential direction of the substrate.

APPENDIX 3

The semiconductor device according to Appendix 1,
wherein a length of the first tip portion in the first direction and a length of the second tip portion in the first direction are different from each other.

APPENDIX 4

The semiconductor device according to Appendix 1,
wherein a first dummy pattern is arranged between the first tip portions of the trenches adjacent to each other in the second direction so as to be spaced apart from the trenches, and a second dummy pattern is arranged between the second tip portions of the trenches adjacent to each other in the second direction so as to be spaced apart from the trenches.

APPENDIX 5

The semiconductor device according to Appendix 4,
wherein the first dummy pattern and the second dummy pattern are triangular or trapezoidal in plan view.

APPENDIX 6

The semiconductor device according to Appendix 1,
wherein the first tip portion and the second tip portion located at the both end portions of the trench in the first direction have a first depth and a second depth, respectively,
the center portion of the trench between the first tip portion and the second tip portion has a third depth, and
the first depth and the second depth are shallower than the third depth.

APPENDIX 7

The semiconductor device according to Appendix 6,
wherein the first depth and the second depth gradually decrease as going toward an outer circumferential direction of the substrate.

As described above, according to the second embodiment, in addition to the consideration to the angle error between the extending direction of the trench DT and the <11-20> direction, the center portion A1 of the trench DT and the first and second tip portions B1 and B2 are made to have different shapes and the first dummy pattern DTR1 and the second dummy pattern DTR2 are arranged, so that the plurality of trenches DT can be favorably backfilled with the semiconductor layer. As a result, the manufacturing yield and the reliability of the semiconductor device can be improved.

In the foregoing, the invention made by the inventors of the present invention has been specifically described based on the embodiments. However, it is needless to say that the present invention is not limited to the foregoing embodiments and various modifications can be made within the scope of the present invention.

For example, in the embodiments described above, the plurality of p-type column regions were formed by forming the plurality of trenches in the n-type epitaxial layer on the n-type substrate and then backfilling the plurality of trenches with the p-type semiconductor layer. In this manner, the super-junction structure constituted of the plurality of p-type column regions and the plurality of n-type column regions each made of the n-type epitaxial layer between the adjacent p-type column regions was formed. However, the present invention is not limited to this. For example, a plurality of n-type column regions may be formed by forming a plurality of trenches in a p-type epitaxial layer on an n-type substrate and then backfilling the plurality of trenches with an n-type semiconductor layer. In this manner, the super-junction structure constituted of the plurality of n-type column regions and the plurality of p-type column regions each made of the p-type epitaxial layer between the adjacent n-type column regions is formed.

In addition, the embodiments described above are not limited to the manufacture of the super-junction structure, and are basic technology for backfilling the inside of a relatively deep trench by the crystal growth. Therefore, the present invention can be applied as long as the substrate and the crystal layer filling the inside of the trench have the same crystal structure even when the substrate and the filling crystal layer have the same conductivity type. As the application like this, for example, a MEMS (Micro Electro Mechanical Systems) device can be assumed.

While the present disclosure has been illustrated and described with respect to a particular embodiment thereof, it should be appreciated by those of ordinary skill in the art that various modifications to this disclosure may be made without departing from the spirit and scope of the present disclosure.

The invention claimed is:
1. A semiconductor device comprising:
a substrate having a main surface provided with an off-angle tilted in a reference crystal direction of a <11-20> direction or a <1-100> direction with respect to a main crystal surface of a (0001) surface or a (000-1);
a plurality of trenches provided in the substrate so as to extend in a first direction along the main surface of the substrate and to be spaced apart from each other in a second direction orthogonal to the first direction along the main surface of the substrate;
a first column region provided in the trench and made of a crystal layer having the same crystal structure as the substrate; and
a second column region made of a part of the substrate between the trenches adjacent to each other in the second direction,
wherein an angle error between the reference crystal direction and the first direction is within ±θ,
when a depth of the trench is h, a width of the trench is w, and k is a coefficient larger than 0 and smaller than 2, the θ is determined by

$$\theta = \{\arctan\{k \times (w/h)\}\}/13,$$

a first tip portion at one end of the trench in the first direction has a first tapered shape whose width becomes narrower toward its tip end in plan view,
a second tip portion at the other end of the trench in the first direction has a second tapered shape whose width becomes narrower toward its tip end in plan view, and a tilt angle of the first tapered shape with respect to the first direction is smaller than a tilt angle of the second tapered shape with respect to the first direction.

2. The semiconductor device according to claim 1, wherein the k is any one of 0.9 or less, 0.5 or less, and 0.3 or less.

3. The semiconductor device according to claim 1, wherein the depth h of the trench is 5 μm or more or 10 μm or more.

4. The semiconductor device according to claim 1, wherein an aspect ratio (h/w) of the trench is 5 or more or 10 or more.

5. The semiconductor device according to claim 1, wherein the substrate includes a hexagonal silicon carbide single crystal substrate,
the reference crystal direction is the <11-20> direction,
the main crystal surface is the (0001) surface, and
the crystal layer is a silicon carbide crystal layer.

6. The semiconductor device according to claim 5, wherein the substrate includes a 4H polytype or 6H polytype silicon carbide single crystal substrate having a first conductivity type and an epitaxial layer having the first conductivity type formed on the silicon carbide single crystal substrate,
the off-angle is 1° or larger and 5° or smaller,
the silicon carbide crystal layer has a second conductivity type different from the first conductivity type, and
the semiconductor device is a MOSFET having a super-junction structure formed of the first column region and the second column region.

7. The semiconductor device according to claim 1, wherein the trench has a tapered shape that becomes narrower as it gets deeper, and
a taper angle formed by a bottom surface and a side surface of the trench is 88° to 90°.

8. The semiconductor device according to claim 1, wherein a first dummy pattern spaced apart from the trenches is formed each between the first tip portions of the plurality of trenches adjacent to each other in the second direction, and
a second dummy pattern spaced apart from the trenches is formed each between the second tip portions of the plurality of trenches adjacent to each other in the second direction.

9. A manufacturing method of a semiconductor device, comprising the steps of:
preparing a substrate which has a main surface provided with an off-angle tilted in a reference crystal direction of a <11-20> direction or a <1-100> direction with respect to a main crystal surface of a (0001) surface or a (000-1) surface and has a reference mark provided so as to have a first angle error with respect to the reference crystal direction;
preparing a photomask for forming an etching pattern on the substrate in order to form, in the substrate, a plurality of trenches extending in a first direction along the main surface of the substrate and spaced apart from each other in a second direction orthogonal to the first direction along the main surface of the substrate;
forming the etching pattern on the substrate by using the photomask;
forming the plurality of trenches in the substrate by using the etching pattern; and
filling insides of the plurality of trenches with a crystal layer having the same crystal structure as the substrate by a crystal growth method,
wherein, when preparing the substrate, the substrate in which the first angle error is within ±θ is selected and prepared, and
when a depth of the trench is h, a width of the trench is w, and k is a coefficient larger than 0 and smaller than 2, the θ is determined by $$\theta = \{\arctan\{k \times (w/h)\}\}/13.$$

10. The manufacturing method of the semiconductor device according to claim 9, wherein the k is any one of 0.9 or less, 0.5 or less, and 0.3 or less.

11. The manufacturing method of the semiconductor device according to claim 9, wherein the depth h of the trench is 5 μm or more or 10 μm or more.

12. The manufacturing method of the semiconductor device according to claim 9, wherein an aspect ratio (h/w) of the trench is 5 or more or 10 or more.

13. The manufacturing method of the semiconductor device according to claim 9, wherein the substrate includes a hexagonal silicon carbide single crystal substrate,
the reference crystal direction is the <11-20> direction,
the main crystal surface is the (0001) surface, and
the crystal layer is a silicon carbide crystal layer.

14. The manufacturing method of the semiconductor device according to claim 13, wherein the substrate includes a 4H polytype or 6H polytype silicon carbide single crystal substrate having a first conductivity type and an epitaxial layer having the first conductivity type formed on the silicon carbide single crystal substrate,
the off-angle is 1° or larger and 5° or smaller,
the silicon carbide crystal layer has a second conductivity type different from the first conductivity type,
the reference mark is an orientation flat or a notch of the substrate, and
the semiconductor device is a MOSFET having a super-junction structure constituted of the trenches filled with the silicon carbide crystal layer.

15. The manufacturing method of the semiconductor device according to claim 13, wherein gas used to grow the silicon carbide crystal layer so as to fill the plurality of trenches includes $H_2$ gas, HCl gas, and $SiH_4$ gas, and an HCl/$SiH_4$ flow ratio is 30 or more and 65 or less and an $H_2$/$SiH_4$ flow ratio is 500 or more and 7,000 or less.

16. The manufacturing method of the semiconductor device according to claim 13, wherein gas used to grow the silicon carbide crystal layer so as to fill the plurality of trenches includes $H_2$ gas, HCl gas, and $SiH_4$ gas, and a pressure in a growth furnace during epitaxial growth is 30 kPa or more and 100 kPa or less.

17. A manufacturing method of a semiconductor device, comprising the steps of:
preparing a substrate which has a main surface provided with an off-angle tilted in a reference crystal direction of a <11-20> direction or a <1-100> direction with respect to a main crystal surface of a (0001) surface or a (000-1) surface and has a reference mark provided so as to have a first angle error with respect to the reference crystal direction;
preparing a photomask for forming an etching pattern on the substrate in order to form, in the substrate, a plurality of trenches extending in a first direction along the main surface of the substrate and spaced apart from each other in a second direction orthogonal to the first direction along the main surface of the substrate;

forming the etching pattern on the substrate by using the photomask;

forming the plurality of trenches in the substrate by using the etching pattern; and filling insides of the plurality of trenches with a crystal layer having the same crystal structure as the substrate by a crystal growth method, wherein, when preparing the substrate, error data of the first angle error in the substrate is measured or the substrate whose error data of the first angle error is specified is prepared, when forming the etching pattern by using the photomask, an angle correction with respect to the reference mark is performed by exposure apparatus using the error data, an angle error between the reference crystal direction and the first direction is within ±θ, and when a depth of the trench is h, a width of the trench is w, and k is a coefficient larger than 0 and smaller than 2, the θ is determined by $$\theta = \{\arctan\{k \times (w/h)\}\}/13.$$

18. The manufacturing method of the semiconductor device according to claim 17,
wherein, when preparing the substrate, the substrate in which the first angle error is within ±θ is selected and prepared.

19. The manufacturing method of the semiconductor device according to claim 17,
wherein the measurement of the first angle error is performed by batch processing for each crystal ingot from which the substrate is cut out, or is performed for each individual piece of the substrate.

* * * * *